US012702033B2

(12) United States Patent
Kuo et al.

(10) Patent No.: US 12,702,033 B2
(45) Date of Patent: Aug. 4, 2026

(54) ELECTRONIC DEVICE

(71) Applicant: Advanced Semiconductor Engineering, Inc., Kaohsiung (TW)

(72) Inventors: Chiung-Ying Kuo, Kaohsiung (TW);
Chun-Yen Ting, Kaohsiung (TW);
Hung-Chun Kuo, Kaohsiung (TW);
Jung Jui Kang, Kaohsiung (TW);
Chang Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 422 days.

(21) Appl. No.: 18/227,887

(22) Filed: Jul. 28, 2023

(65) Prior Publication Data
US 2025/0038084 A1 Jan. 30, 2025

(51) Int. Cl.
*H10W 70/685* (2026.01)
*H10W 70/65* (2026.01)
*H10W 90/00* (2026.01)

(52) U.S. Cl.
CPC ......... *H10W 70/685* (2026.01); *H10W 70/65* (2026.01); *H10W 90/794* (2026.01)

(58) Field of Classification Search
None
See application file for complete search history.

(56) References Cited

U.S. PATENT DOCUMENTS

| | | | | |
|---|---|---|---|---|
| 11,581,281 B2 * | 2/2023 | Yu | | H01L 25/0657 |
| 2012/0292777 A1 | 11/2012 | Lotz | | |
| 2022/0392832 A1 * | 12/2022 | Chen | | H01L 24/81 |

* cited by examiner

*Primary Examiner* — Nicholas J Tobergte
(74) *Attorney, Agent, or Firm* — Foley and Lardner LLP

(57) ABSTRACT
An electronic device is disclosed. The electronic device includes an electronic component, an input/output (I/O) signal delivery circuit, and a power delivery circuit. The electronic component has a first surface and a second surface opposite to the first surface. The I/O signal delivery circuit is disposed under the first surface of the electronic component. The power delivery circuit is disposed over the second surface of the electronic component and configured to balance a warpage of the electronic device.

13 Claims, 35 Drawing Sheets

1a

1d

1a

42

31-n+1

32-n 31-n

30

⋮

31-2

32-1

32v 31v 31-1

31d

10s2

14

10

12

10s1

11

20

21-1

41

31-1
10s2
12
10s1
11
21-1
10
20
53

ELECTRONIC DEVICE

BACKGROUND

1. Field of the Disclosure

The present disclosure generally relates to an electronic device.

2. Description of the Related Art

High performance computing (HPC) systems for electronic devices impose challenging demands on power consumption and heat dissipation characteristics of power supply units. Power routing paths for transmitting power signals are usually provided by a system board, over which several dies are mounted. Layout design may be constrained by the need to minimize electromagnetic interference between power signals and non-power signals (e.g., electrical signals), which can limit the ability to miniaturize the system board.

The voltage and power requirements of the dies vary, and the inevitable expansion in the total number and variety of dies has led to a corresponding increase in the number of power routing paths. One approach to providing more stabilized power routing paths is to provide power through the power regulating components over an interconnection structure or an interconnection die. However, this may increase the size of the electronic device and put undesirable constraints on miniaturization of the electronic device.

SUMMARY

In some embodiments, an electronic device includes an electronic component, an input/output (I/O) signal delivery circuit, and a power delivery circuit. The electronic component has a first surface and a second surface opposite to the first surface. The I/O signal delivery circuit is disposed under the first surface of the electronic component. The power delivery circuit is disposed over the second surface of the electronic component and configured to balance a warpage of the electronic device.

In some embodiments, an electronic device includes an electronic component, a first redistribution structure, and a reinforcement structure. The electronic component has a front surface and a backside surface opposite to the front surface. The first redistribution structure is disposed over the backside surface of the electronic component. The reinforcement structure is disposed over the first redistribution structure. The first redistribution structure and the reinforcement structure are collectively configured to transmit a power to the electronic component.

In some embodiments, an electronic device includes a logic circuit, an input/output (I/O) signal delivery circuit, and a power delivery circuit. The I/O signal delivery circuit is disposed at a first side of the logic circuit and configured to transmit a signal to an external device. The power delivery circuit is disposed at a second side of the logic circuit. The power delivery circuit comprises a plurality of reinforcement structures configured to enhance a rigidity of the electronic device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
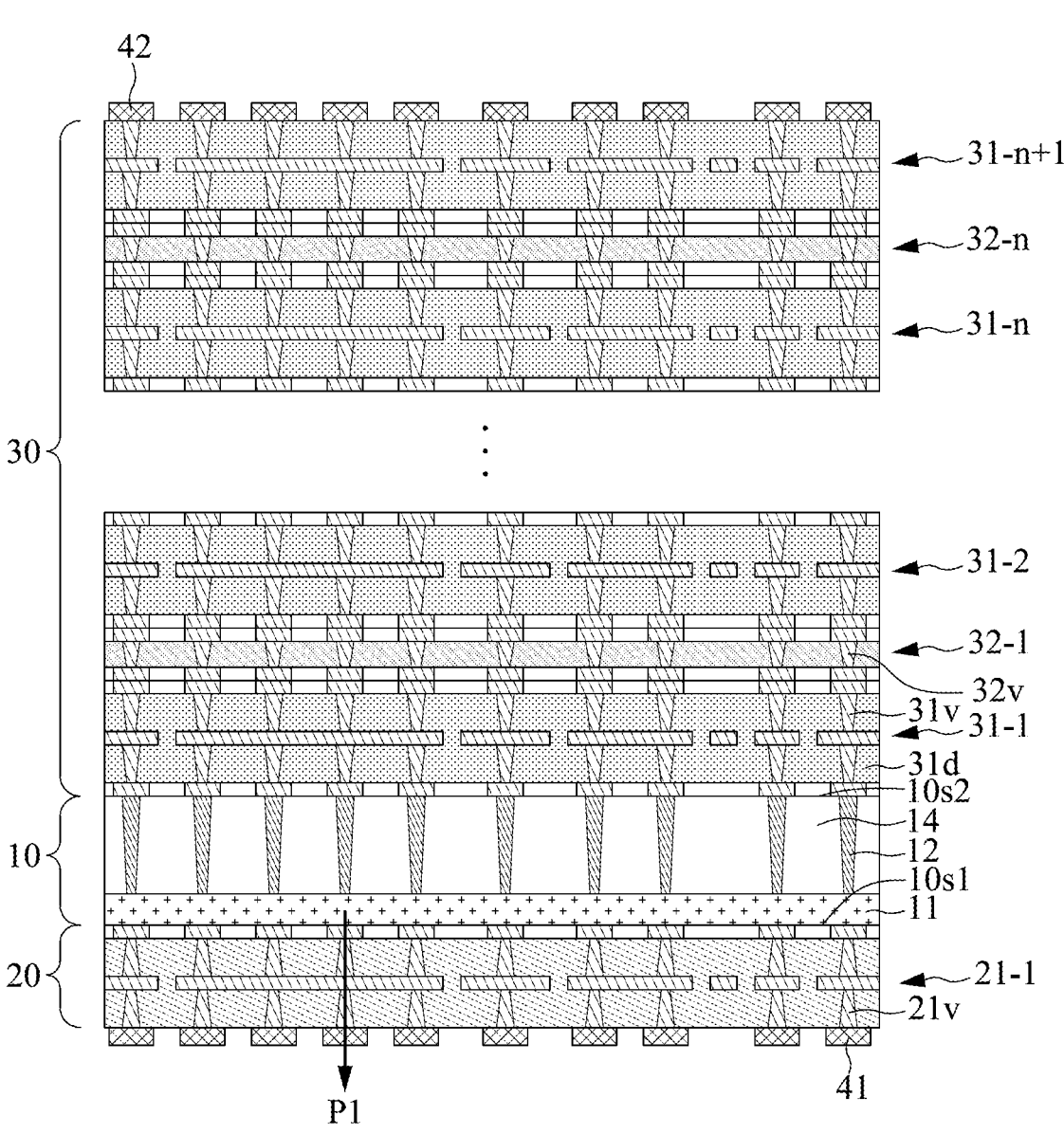
FIG. 1 illustrates a cross-sectional view of an example electronic device according to some embodiments of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

FIG. 1 illustrates a cross-sectional view of an example electronic device 1a according to some embodiments of the present disclosure. In some embodiments, the electronic device 1a may include an electronic component 10, an input/output (I/O) signal delivery circuit 20, and a power delivery circuit 30.

The electronic component 10 may include a chip. In some embodiments, the electronic component 10 may include a circuit structure. The electronic component 10 may include an active component that relies on an external power supply to control, output, or modify electrical signals. For example, the electronic component 10 may include a processor, a controller, a memory, an input/output (I/O) buffer, etc. The electronic component 10 may include a system on chip (SoC), a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

The electronic component 10 may include a surface $10s1$ and a surface $10s2$ opposite to the surface $10s1$. The surface $10s1$ (or a lower surface or a front surface) may be configured to transmit a signal (e.g., I/O signal) to other devices (not shown). In some embodiments, the surface $10s2$ (or an upper surface or a backside surface) may be configured to receive a power (or a power signal) to enable the integrated circuits (ICs) of the electronic component 10.

The electronic component 10 may include a circuit layer 11, conductive vias 12, and a base portion 14. The circuit layer 11 may be disposed adjacent to the surface $10s1$ of the electronic component 10. The circuit layer 11 may include one or more ICs, such as a logic circuit (or a logic portion), a memory circuit, or other suitable circuits. The logic circuit may include at least one transistor and/or other elements. The circuit layer 11 may also include passive circuits, such as a resistor, a capacitor, an inductor, or a combination thereof.

The conductive via 12 may be disposed adjacent to the surface $10s2$ of the electronic component 10. The conductive via 12 may be electrically connected to the circuit layer 11. The conductive via 12 may penetrate or pass through the base portion 14. In some embodiments, the conductive via 12 may be configured to transmit a power (or a power signal) to the circuit layer 11. In some embodiments, each of the conductive vias 12 may include, for example, a through-silicon via (TSV) or other suitable elements. In some embodiments, each of the conductive vias 12 may be tapered along a direction from the surface $10s2$ toward the surface $10s1$ of the electronic component 10. Although not shown, the electronic component 10 may include a redistribution structure(s) disposed between the circuit layer 11 and the conductive via 12 for connecting the circuit layer 11 and the conductive via 12 and/or disposed at the surface $10s1$ for connecting the electronic component 10 and external devices.

The base portion 14 may include a semiconductor material, such as silicon, germanium, silicon germanium, and III-V materials such as InP, GaAs, GaSb, or the like. The circuit layer 11 may be disposed or formed within the base portion 14.

In some embodiments, the I/O signal delivery circuit 20 may be disposed on or under the surface $10s1$ of the electronic component 10. The I/O signal delivery circuit 20 may be supported by the base portion 14. The I/O signal delivery circuit 20 may be configured to transmit and/or receive an I/O signal, which may include or be composed of alternating current (AC), in communication between and/or among chips.

In some embodiments, the I/O signal delivery circuit 20 may include a redistribution structure 21-1. The redistribution structure 21-1 may be supported by the base portion 14. The redistribution structure 21-1 may include one or more dielectric layers as well as conductive trace(s), conductive pad(s), and/or conductive via(s) embedded in or disposed on the dielectric layer(s). In some embodiments, each of conductive vias $21v$ of the redistribution structure 21-1 may be tapered toward the electronic component 10. In some embodiments, the material of the dielectric layer may include, for example, benzocyclobutene (BCB) or other suitable materials. The electronic device 1a may include a signal path P1 for transmitting an I/O signal. The signal path P1 may pass through the I/O signal delivery circuit 20 or pass through the redistribution structure 21-1.

The electronic device 1a may further include terminals 41. The terminal 41 may be disposed on or under the redistribution structure 21-1. The terminal 41 may be configured to electrically connect the electronic device 1a and an external device, such as a printed circuit board (PCB), a package structure, an antenna, or other suitable devices. The terminal 41 may include a conductive pad, which may include copper, aluminum, chromium, tin, gold, silver, nickel, or stainless steel, or a mixture, an alloy, or other combination thereof. In some embodiments, the terminal 41 may further include solder materials, which may include alloys of gold and tin solder or alloys of silver and tin solder, or other suitable materials.

The power delivery circuit 30 may be disposed on or over the surface $10s2$ of the electronic component 10. In some embodiments, the power delivery circuit 30 may be configured to transmit or receive a power (or a power signal), which may include or be composed of direct current (DC). In some embodiments, the power delivery circuit 30 may include two or more redistributions. For example, the power delivery circuit 30 may include redistribution structures 31-1, 31-2, . . . , 31-$n$, and 31-$n$+1. In some embodiments, the power delivery circuit 30 may include two or more reinforcement structures. For example, the power delivery circuit 30 may include reinforcement structures 32-1 to 32-$n$, wherein n is a positive integer, such as 2, 3, 4, 5, 6, or more. In some embodiments, each of the reinforcement structures 32-1 to 32-$n$ may be disposed or interposed between two of the redistribution structures 31-1 to 31-$n$+1.

The redistribution structure 31-1 may be disposed on or over the surface $10s2$ of the electronic component 10. The redistribution structure 31-1 may be electrically connected to the electronic component 10. The redistribution structure 31-1 may be configured to transmit or receive a power (or a power signal). The redistribution structure 31-1 may include one or more dielectric layers as well as conductive trace(s), conductive pad(s), and/or conductive via(s) embedded in or disposed on the dielectric layer(s), which will be discussed in detail with reference to FIG. 2C.

In some embodiments, the reinforcement structure 32-1 may be disposed on or over the redistribution structure 31-1. In some embodiments, the reinforcement structure 32-1 may be configured to transmit or receive a power (or a power signal). In some embodiments, the reinforcement structure 32-1 may be configured to balance the warpage or stress on two opposite surfaces 10s1 and 10s2 of the electronic component 10. In some embodiments, the reinforcement structure 32-1 may be configured to enhance the rigidity of the electronic device 1a or enhance the rigidity of the power delivery circuit 30. In some embodiments, the reinforcement structure 32-1 may include an interposer, such as a silicon interposer, a glass interposer, a ceramic interposer, or a sapphire interposer. The reinforcement structure 32-1 may further include conductive elements, such as through-vias or traces within the interposer (or substrate) of the reinforcement structure 32-1, which will be described in detail with reference to FIG. 4.

The redistribution structure 31-2 may be disposed on or over the reinforcement structure 32-1. The reinforcement structure 32-1 may be disposed between the redistribution structures 31-1 and 31-2. The redistribution structure 31-2 may be electrically connected to the electronic component 10 through the reinforcement structure 32-1 and the redistribution structure 31-1. The reinforcement structure 32-1 may be configured to transmit or receive a power (or a power signal). In some embodiments, the material and structure of the redistribution structure 31-2 may be the same as or similar to those of the redistribution structure 31-1.

The reinforcement structure 32-n may be disposed on or over the redistribution structure 31-n. In some embodiments, the material and structure of the reinforcement structure 32-n may be the same as or similar to those of the reinforcement structure 32-1.

The redistribution structure 31-n+1 may be disposed on or over the reinforcement structure 32-n. The redistribution structure 31-n+1 may be the outermost redistribution structure of the power delivery circuit 30.

The electronic device 1a may further include terminals 42. The terminal 42 may be disposed on or over the redistribution structure 31-n+1. The terminal 42 may be configured to electrically connect the electronic device 1a and an external device, such as a power supply circuit or a circuit for transmitting a power signal. The terminal 42 may include a conductive pad, which may include copper, aluminum, chromium, tin, gold, silver, nickel, or stainless steel, or a mixture, an alloy, or other combination thereof.

In some embodiments, the thicknesses of the reinforcement structures 32-1 to 32-n may increase or decrease along a direction from the electronic component 10 toward the terminals 42. In some embodiments, the thickness of the reinforcement structure 32-n may be greater than the thickness of the reinforcement structure 32-1. In some embodiments, the thickness of the reinforcement structure 32-n may be less than the thickness of the reinforcement structure 32-1.

In some embodiments, the thicknesses of the redistribution structures 31-1 to 31-n+1 may increase or decrease along a direction from the electronic component 10 toward the terminals 42. In some embodiments, the thickness of the redistribution structure 31-n+1 may be greater than the thickness of the redistribution structure 31-1. In some embodiments, the thickness of the redistribution structure 31-n+1 may be less than the thickness of the redistribution structure 31-1.

Figure 2A:
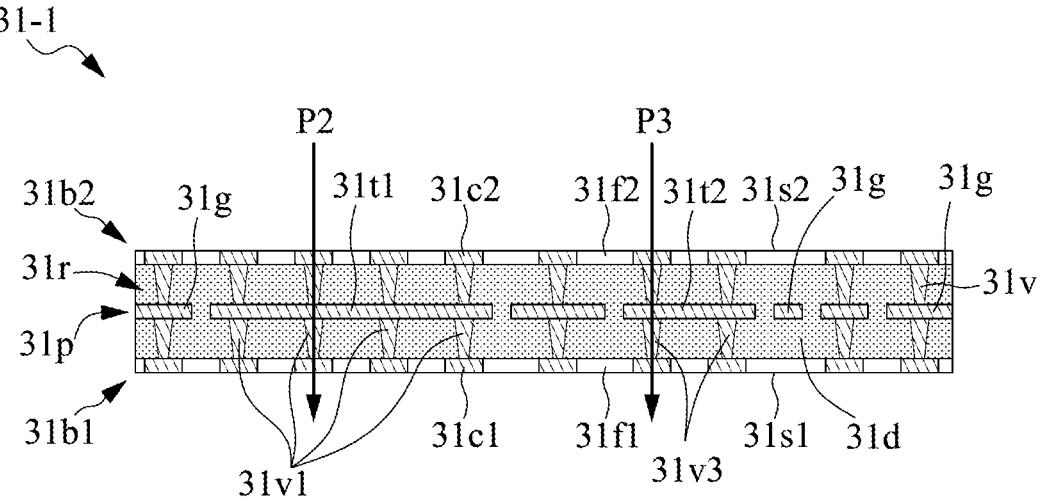
FIG. 2A illustrates an enlarged view of the redistribution structure as shown in FIG. 1 according to some embodiments of the present disclosure.

FIG. 2A illustrates an enlarged view of the redistribution structure 31-1 as shown in FIG. 1 according to some embodiments of the present disclosure. In some embodiments, the redistribution structure 31-1 may include a dielectric structure 31d and a conductive structure 31r. The redistribution structure 31-1 may include a surface 31s1 (or a lower surface) and a surface 31s2 (or an upper surface) opposite to the surface 31s1. The surface 31s1 may face the electronic component 10 as shown in FIG. 1. The surface 31s2 may face the reinforcement structure 32-1 as shown in FIG. 1.

In some embodiments, the dielectric structure 31d may include two or more dielectric layers, such as two, three or four dielectric layers. In some embodiments, the material of the dielectric structure 31d may be different from that of the dielectric material of the redistribution structure 21-1. In some embodiments, the coefficient of thermal expansion (CTE) of the dielectric structure 31d may be different from that of the dielectric material of the redistribution structure 21-1. In some embodiments, the dielectric structure 31d may include polyimide (PI) or other suitable materials.

The conductive structure 31r may be disposed within the dielectric structure 31d. The conductive structure 31r may include at least one conductive layer 31p and conductive vias 31v. The conductive layer 31p may be disposed on or over one of the dielectric layers of the dielectric structure 31d. The conductive via 31v may be connected to the conductive layer 31p. The conductive via 31v may penetrate one of the dielectric layers of the dielectric structure 31d. In some embodiments, each of the conductive vias 31v may be tapered toward the electronic component 10 as shown in FIG. 1.

In some embodiments, a bonding structure 31b1 may be disposed on or under a lower surface of the dielectric structure 31d. The bonding structure 31b1 may function as a bonding surface for connecting another bonding surface by a hybrid-bonding technique, which involves a bonding between dielectric layers and a bonding between metals or alloys. The bonding structure 31b1 may include a dielectric layer 31f1 (or a connection layer or a hybrid-bonding layer) and conductive elements 31c1 (or conductive layers). The lower surface of the bonding structure 31b1 may serve as the surface 31s1 of the redistribution structure 31-1.

The dielectric layer 31f1 may be disposed on or under the lower surface of the dielectric structure 31d. The material of the dielectric layer 31f1 may be different from that of the dielectric structure 31d. In some embodiments, the dielectric layer 31f1 may include oxide, nitride, oxynitride, or other suitable materials.

The conductive element 31c1 may be embedded within the dielectric layer 31f1. The conductive element 31c1 may be exposed by the dielectric layer 31f1. The conductive element 31c1 may include copper or other suitable materials.

In some embodiments, a bonding structure 31b2 may be disposed on or over an upper surface of the dielectric structure 31d. The bonding structure 31b2 may function as a bonding surface for connecting another bonding surface by a hybrid-bonding technique, which involves a bonding between dielectric layers and a bonding between metals or alloys. The bonding structure 31b2 may include a dielectric layer 31f2 (or dielectric elements) and conductive element 31*c*2 (or conductive layers). The upper surface of the bonding structure 31*b*2 may serve as the surface 31*s*2 of the redistribution structure 31-1.

The dielectric layer 31*f*2 may be disposed on or over the upper surface of the dielectric structure 31*d*. The material of the dielectric layer 31*f*2 may be different from that of the dielectric structure 31*d*. In some embodiments, the dielectric layer 31*f*2 may include oxide, nitride, oxynitride, or other suitable materials.

The conductive element 31*c*2 may be embedded within the dielectric layer 31*f*2. The conductive element 31*c*2 may be exposed by the dielectric layer 31*f*2. The conductive element 31*c*2 may include copper or other suitable materials.

In some embodiments, the thickness of the redistribution structure 31-1 may range from about 30 nm to about 80 nm.

Figure 2B:
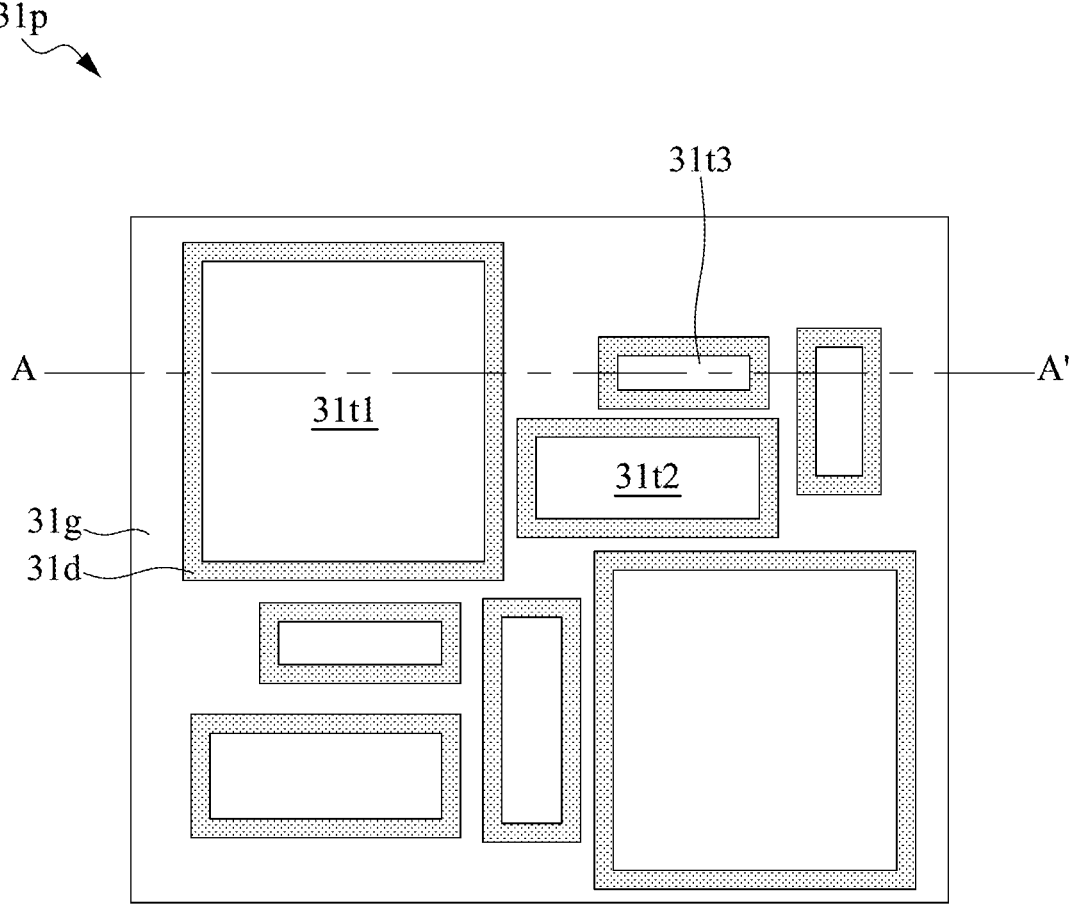
FIG. 2B illustrates a layout of a conductive layer of the redistribution structure as shown in FIG. 2A according to some embodiments of the present disclosure.

FIG. 2B illustrates a layout of the conductive layer 31*p* of the redistribution structure 31-1. In some embodiments, the conductive layer 31*p* may include conductive patterns 31*t*1, 31*t*2, and 31*t*3 as well as a ground layer 31*g*. In some embodiments, the conductive patterns 31*t*1, 31*t*2, and 31*t*3 as well as the ground layer 31*g* may be separated by the dielectric structure 31*d*. In some embodiments, the conductive patterns 31*t*1, 31*t*2, and 31*t*3 may have different dimensions (e.g., surface areas). The surface area of the conductive pattern 31*t*1 may be greater than that of the conductive pattern 31*t*2. The surface area of the conductive pattern 31*t*2 may be greater than that of the conductive pattern 31*t*3. In some embodiments, the conductive patterns 31*t*1, 31*t*2, and 31*t*3 may be configured to transmit different levels of power. For example, the conductive pattern 31*t*1 may be configured to transmit or receive a power of 5V or higher; the conductive pattern 31*t*2 may be configured to transmit or receive a power ranging from about 1.5V to about 3.5V; the conductive pattern 31*t*3 may be configured to transmit or receive a power ranging from about 0.5V to about 1V. Referring back to FIG. 2A, a power path P2 and a power path P3 may pass through the redistribution structure 31-1 by passing through different conductive patterns 31*t*1 and 31*t*2 of different dimensions. The power (or power level or voltage) in the power path P2 may be different from that in the power path P3.

As described above, the electronic component 10 may have different ICs, which require different powers (or different levels of power). Thus, the power delivery circuit 30 needs power paths for delivering said powers. In this embodiment, the conductive layer 31*p* includes conductive patterns 31*t*1, 31*t*2, and 31*t*3 with different surface areas, which thereby facilitates the impedance matching of different powers.

The ground layer 31*g* may be configured to transmit or receive a grounding signal. The ground layer 31*g* may be electrically connected to ground. The ground layer 31*g* may be exposed by a lateral surface (not annotated) of the dielectric structure 31*d*. The ground layer 31*g* may enclose the conductive patterns 31*t*1, 31*t*2, and 31*t*3.

Figure 2C:
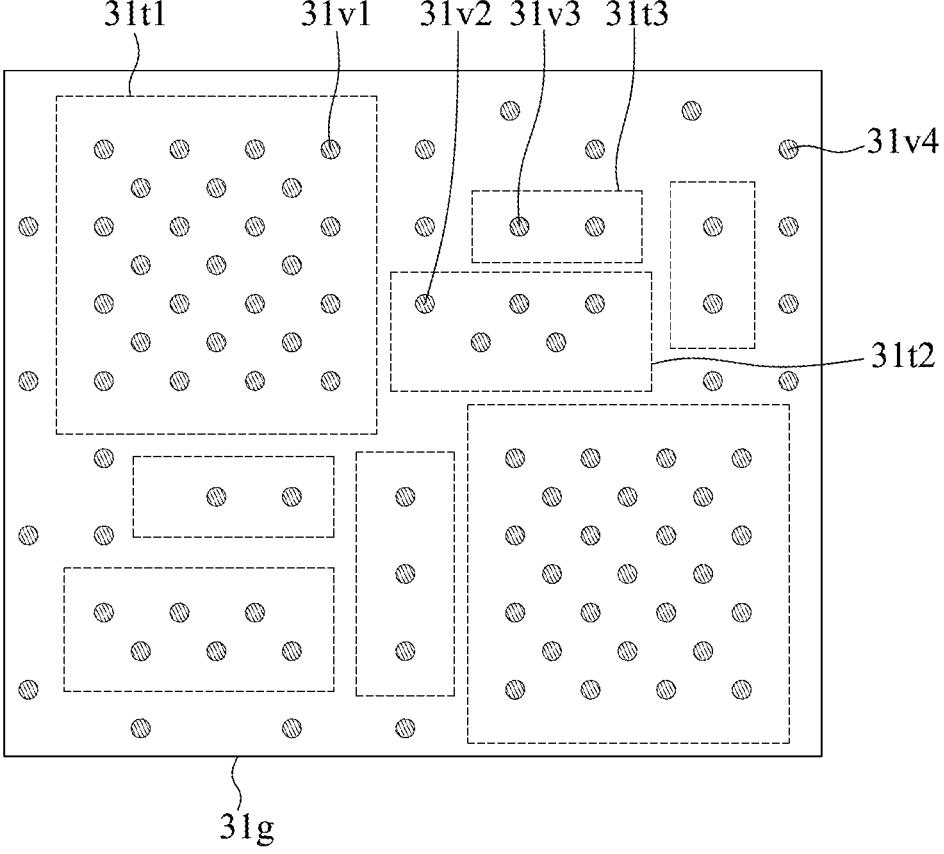
FIG. 2C illustrates a layout of conductive vias of the redistribution structure as shown in FIG. 2A according to some embodiments of the present disclosure.

FIG. 2C illustrates a layout of the conductive vias of the redistribution structure 31-1. In some embodiments, conductive vias 31*v*1, 31*v*2, 31*v*3, and 31*v*4 are disposed on different regions. The conductive via 31*v*1 may be connected to the conductive pattern 31*t*1. The conductive via 31*v*2 may be connected to the conductive pattern 31*t*2. The conductive via 31*v*3 may be connected to the conductive pattern 31*t*3. The conductive via 31*v*4 may be connected to the ground layer 31*g*. In some embodiments, each of the conductive vias 31*v*1, 31*v*2, 31*v*3, and 31*v*4 may have the same dimension (e.g., diameter, or width), which reduces the cost of manufacture of the electronic device. For example, a laser drilling technique may be used to define the holes of the conductive vias 31*v*1, 31*v*2, 31*v*3, and 31*v*4, When the conductive vias 31*v*1, 31*v*2, 31*v*3, and 31*v*4 have the same dimension, the powers of a laser may be the same for forming the holes of the conductive vias 31*v*1, 31*v*2, 31*v*3, and 31*v*4. When the conductive vias 31*v*1, 31*v*2, 31*v*3, and 31*v*4 have different dimensions, different powers of a laser may be used to define the holes of conductive vias 31*v*1, 31*v*2, 31*v*3, and 31*v*4, which may increase the process time of the laser drilling technique. In some embodiments, the density of the conductive vias 31*v*1 may be substantially the same as that of the conductive vias 31*v*2 and 31*v*3. In some embodiments, the density of the conductive vias 31*v*1 may be different from that of the conductive vias 31*v*4. In some embodiments, the quantity of the conductive vias (e.g., 31*v*1) connected to or disposed on the conductive pattern 31*t*1 may be different from those connected to or disposed on the conductive pattern 31*t*2 (or 31*t*3). For example, the quantity of the conductive vias 31*v*1 may be greater than that of the conductive vias 31*v*2; the quantity of the conductive vias 31*v*2 may be greater than that of the conductive vias 31*v*3, which thereby facilitates the impedance matching of different power paths. Since the conductive pattern 31*t*1 has a relatively large dimension, more conductive vias 31*v*1 may be connected to the conductive pattern 31*t*1. As a result, the conductive pattern 31*t*1 may be configured to transmit a relatively great power by a power path with a smaller impedance (or a smaller equivalent impedance).

Figure 3:
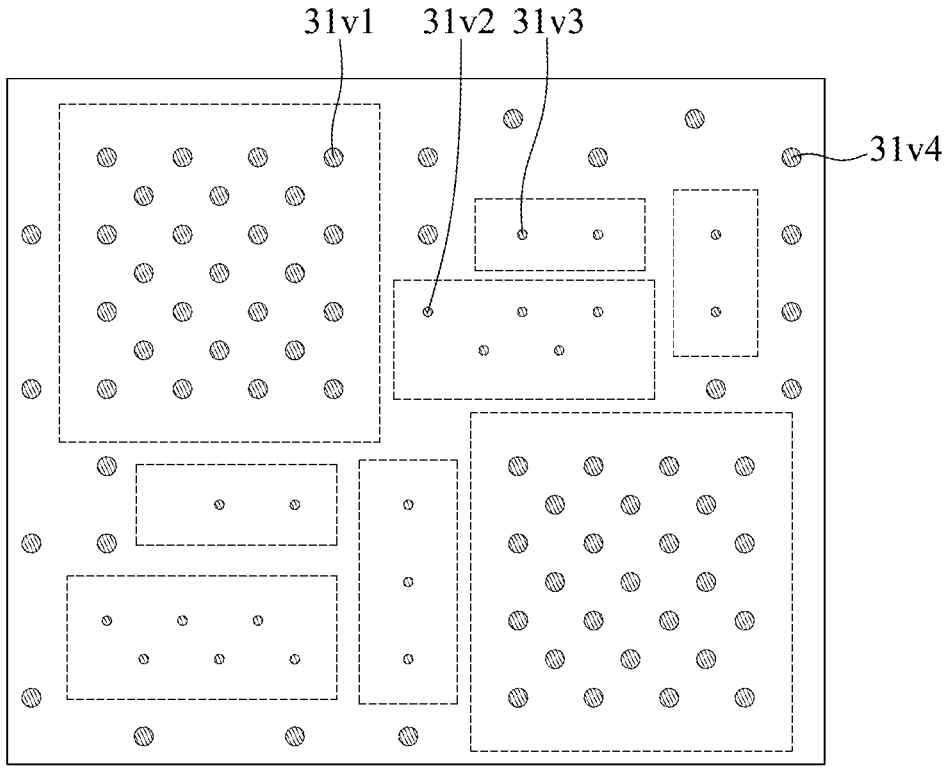
FIG. 3 illustrates a layout of conductive vias according to other embodiments of the present disclosure.

FIG. 3 illustrates a layout of conductive vias according to other embodiments of the present disclosure. In some embodiments, the conductive vias 31*v*1, 31*v*2, 31*v*3, and 31*v*4 may have different dimensions (e.g., surface areas). For example, the diameter or width of the conductive via 31*v*1 may be greater than that of the conductive via 31*v*2 (or 31*v*3), which thereby facilitates the impedance matching of different power paths.

Figure 4:
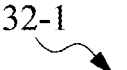
FIG. 4 illustrates an enlarged view of the reinforcement structure as shown in FIG. 1 according to some embodiments of the present disclosure.
Figure 4:
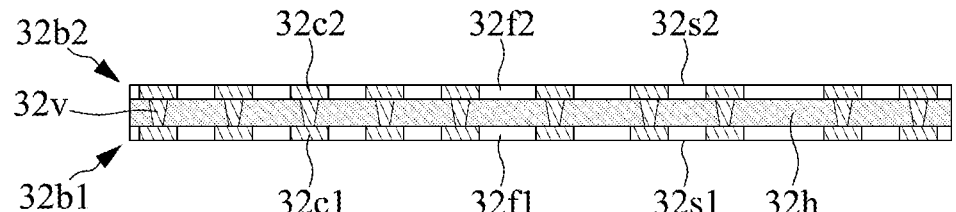

FIG. 4 illustrates an enlarged view of the reinforcement structure 32-1 as shown in FIG. 1 according to some embodiments of the present disclosure. The reinforcement structure 32-1 may include a substrate 32*h* and conductive vias 32*v*. The substrate 32*h* may include a semiconductor material, such as silicon. The substrate 32*h* may include a glass, a ceramic, or a sapphire substrate. The conductive via 32*v* may penetrate the reinforcement structure 32-1 (or substrate 32*h*). The conductive via 32*v* may include a through-silicon via (TSV), a through-glass via (TGV), or other suitable elements. In some embodiments, each of the conductive vias 32*v* may be tapered toward the electronic component 10 as shown in FIG. 1.

In some embodiments, a bonding structure 32*b*1 may be disposed on or under a lower surface of the substrate 32*h*. The bonding structure 32*b*1 may function as a bonding surface for connecting another bonding surface by a hybrid-bonding technique. The bonding structure 32*b*1 may include a dielectric layer 32*f*1 (or a connection layer or a hybrid-bonding layer or a dielectric element) and conductive elements 32*c*1 (or conductive layers).

The dielectric layer 32*f*1 may be disposed on or under the lower surface of the substrate 32*h*. In some embodiments, the dielectric layer 32*f*1 may include oxide, nitride, oxynitride, or other suitable materials.

The conductive element 32*c*1 may be embedded within the dielectric layer 32*f*1. The conductive element 32*c*1 may be exposed by the dielectric layer 32*f*1. The conductive element 32*c*1 may be exposed by a surface 32*s*1 (or a lower surface) of the reinforcement structure 32-1. The conductive element 32c1 may include copper or other suitable materials.

In some embodiments, a bonding structure 32b2 may be disposed on or over an upper surface of the substrate 32h. The bonding structure 32b2 may function as a bonding surface for connecting another bonding surface by a hybrid-bonding technique. The bonding structure 32b2 may include a dielectric layer 32f2 and conductive elements 32c2.

The dielectric layer 32f2 may be disposed on or over the upper surface of the substrate 32h. In some embodiments, the dielectric layer 32f2 may include oxide, nitride, oxynitride, or other suitable materials.

The conductive element 32c2 may be embedded within the dielectric layer 32f2. The conductive element 32c2 may be exposed by the dielectric layer 32f2. The conductive element 32c2 may be exposed by a surface 32s2 (or an upper surface) of the reinforcement structure 32-2. The conductive element 32c2 may include copper or other suitable materials.

In some embodiments, the thickness of the reinforcement structure 32-1 may range from about 0.5 times and 8 times of the thickness of the redistribution structure 31-1. When the thickness of the reinforcement structure 32-2 is less than 0.5 times of the redistribution structure 31-1, a crack may occur in the reinforcement structure 32-1; when the thickness of the reinforcement structure 32-2 is greater than 8 times of the redistribution structure 31-1, the thickness of the overall structure is too thick.

As described above, when the electronic component 10 has more functions, different powers (or different levels of power) are required to integrate said functions of the electronic component 10. In this case, more power delivery circuits are required, which thereby increases the layers of the conductive traces and conductive vias. As a result, the electronic component 10 may suffer an imbalance of the stresses imposed on two opposite sides during a manufacturing process. In this embodiment, the reinforcement structure 32-1 may be configured to balance the warpage on the surfaces 10s1 and 10s2 of the electronic component 10. The reinforcement structure 32-1 may enhance the rigidity of the power delivery circuit 30, which increases the tolerance for forming more layers of the conductive traces and conductive vias for power routing. Further, the yield of manufacturing an electronic device 1a may be improved.

Figure 5A:
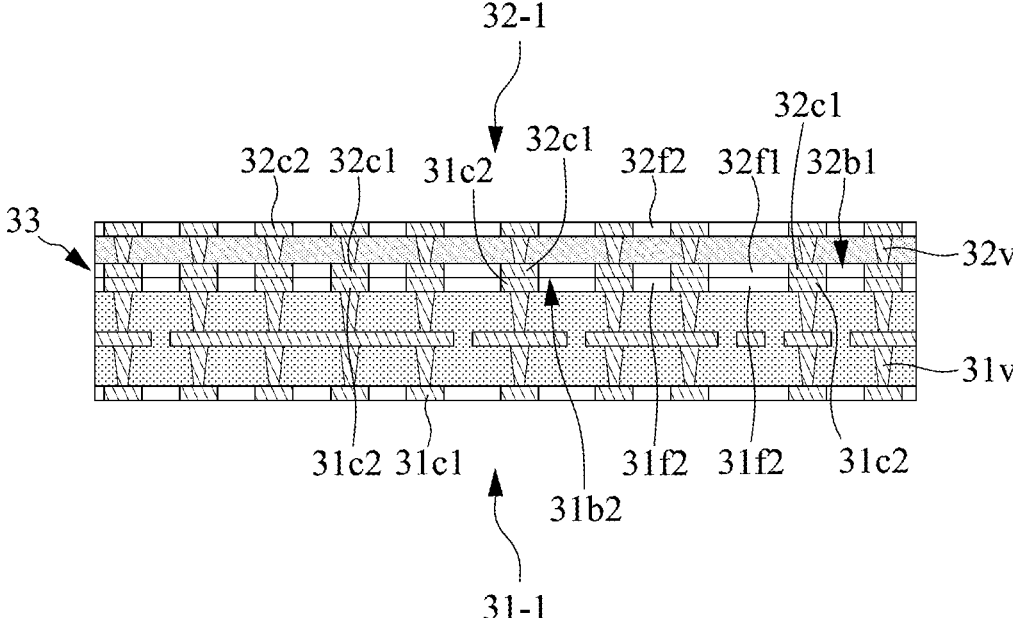
FIG. 5A illustrates a bonding structure according to some embodiments of the present disclosure.

FIG. 5A illustrates a bonding of the redistribution structure 31-1 and reinforcement structure 32-1 according to some embodiments of the present disclosure. In some embodiments, a hybrid-bonding structure 33 may be disposed between the redistribution structure 31-1 and reinforcement structure 32-1. The hybrid-bonding structure 33 may be a structure formed by a hybrid-bonding technique. For example, the hybrid-bonding structure 33 may include the bonding structures 31b2 and 32b1. In some embodiments, there are no boundaries between the bonding structures 31b2 and 32b1. In some embodiments, there is a nonobvious boundary between the bonding structures 31b2 and 32b1. In some embodiments, the dielectric layer 31f2 may be bonded or directly bonded to the dielectric layer 32f1. In some embodiments, the conductive elements 31c2 may be bonded or directly bonded to the conductive elements 32c1. In some embodiments, the conductive elements 31c2 may be substantially aligned with the conductive elements 32cl. In some embodiments, the conductive vias 31v may be substantially aligned with the conductive vias 32v. It should be notated that another hybrid-bonding structure 33 may be disposed between the redistribution structure 31-2, as shown in FIG. 1, and the reinforcement structure 32-1.

Figure 5B:
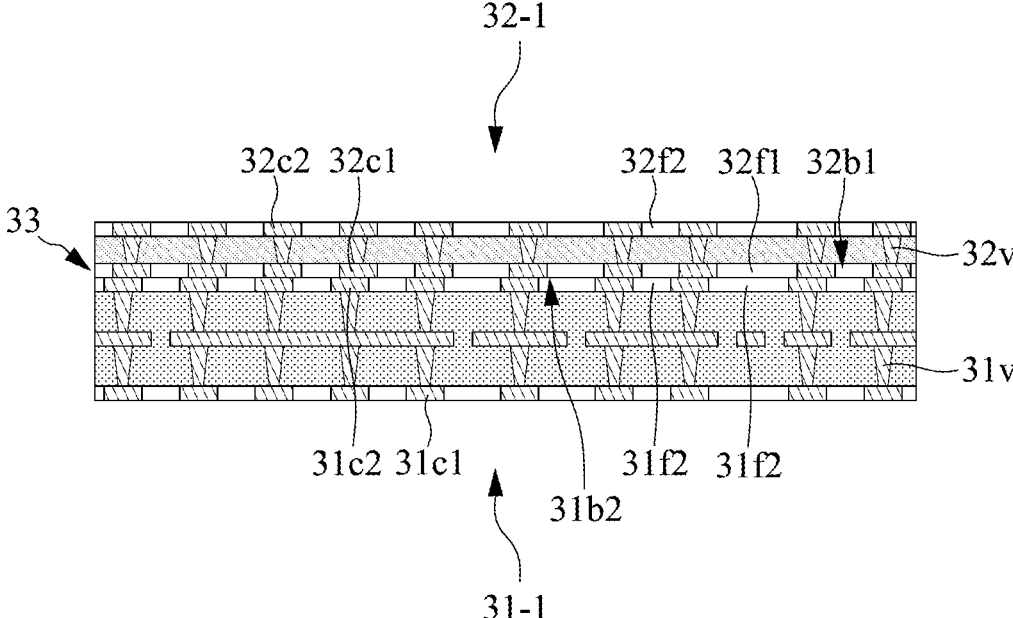
FIG. 5B illustrates a bonding structure according to some embodiments of the present disclosure.

FIG. 5B illustrates a bonding of the redistribution structure 31-1 and reinforcement structure 32-1 according to some embodiments of the present disclosure. In some embodiments, the redistribution structure 31-1 may be partially misaligned with the reinforcement structure 32-1. In some embodiments, the conductive elements 31c2 may be bonded to and partially misaligned with the conductive elements 32c1. For example, a portion of the upper surface of the conductive element 31c2 is exposed by the conductive element 32cl. In this embodiment, the conductive via 31v1 may be partially misaligned with the conductive via 32v1.

Figure 6A:
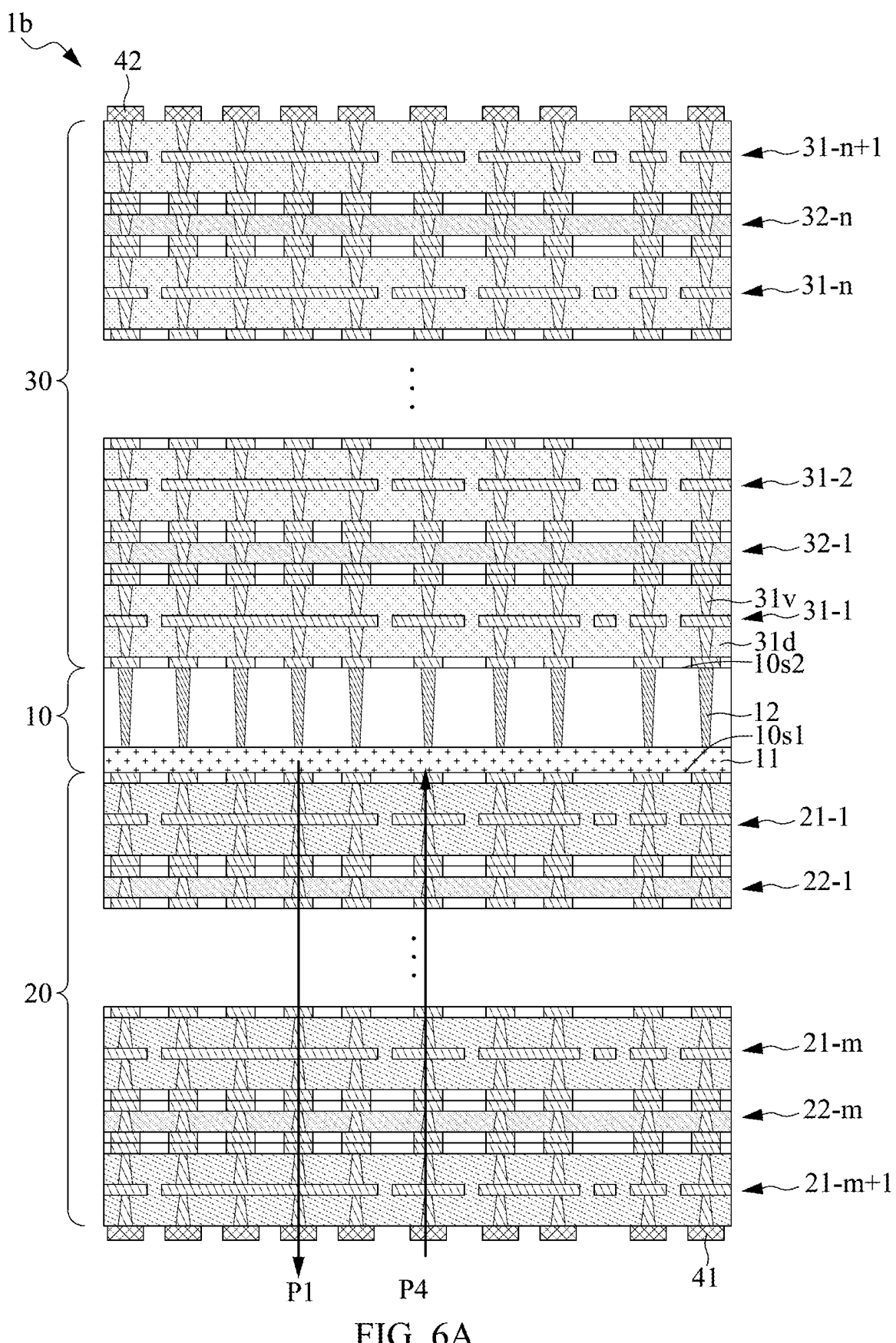
FIG. 6A illustrates a cross-sectional view of an example electronic device according to some embodiments of the present disclosure.

FIG. 6A illustrates a cross-sectional view of an example electronic device 1b according to some embodiments of the present disclosure. The electronic device 1b is similar to the electronic device 1a as shown in FIG. 1, with differences therebetween as follows.

In some embodiments, the I/O signal delivery circuit 20 may include redistribution structures 21-1 to 21-m+1 and reinforcement structures 22-1 to 22-m, wherein m is a positive integer, such as 1, 2, 3, 4, 5, or 6. In some embodiments, m is different from n. In some embodiments, m is less than n. In some embodiments, a thickness of the I/O signal delivery circuit 20 may be less than a thickness of the power delivery circuit 30.

In some embodiments, the reinforcement structure 22-1 may be disposed on or under the redistribution structure 21-1. In some embodiments, the reinforcement structure 22-1 may be configured to transmit or receive a signal (or I/O signal). In some embodiments, the reinforcement structure 22-1 may be configured to balance the warpage or stress on two opposite surfaces 10s1 and 10s2 of the electronic component 10. In some embodiments, the reinforcement structure 22-1 may be configured to enhance the rigidity of the electronic device 1a or enhance the rigidity of the I/O signal delivery circuit 20. In some embodiments, the reinforcement structure 22-1 may include an interposer, such as a silicon interposer, a glass interposer, a ceramic interposer, or a sapphire interposer. The reinforcement structure 22-1 may further include conductive elements, such as through-vias or traces within the interposer of the reinforcement structure 32-1, which will be described in detail with reference to FIG. 6B.

The reinforcement structure 22-m may be disposed on or under the redistribution structure 21-m. The redistribution structure 21-m+1 may be disposed on or under the reinforcement structure 22-m. The structure of the reinforcement structure 22-m may be the same as or similar to that of the reinforcement structure 22-1. The redistribution structure 21-m+1 may be the outermost redistribution structure of the I/O signal delivery circuit 20. The structure of the redistribution structures 21-m and 21-m+1 may be the same as or similar to that of the redistribution structure 21-1.

In this embodiment, the reinforcement structures 22-1 to 22-m may be configured balance the warpage of the electronic device 1b, which thereby facilitates the manufacturing of the electronic device. In this embodiment, the signal path P1 may further pass through the reinforcement structures 22-1 to 22-m.

In some embodiments, some traces (or vias) of the redistribution structures 21-1 to 21-m+1 and reinforcement structures 22-1 to 22-m may be configured to transmit power. The electronic device 1b may include a power path P4 for transmitting power. The power path P4 may pass through the redistribution structures 21-1 to 21-$m$+1. The power path P4 may pass through the reinforcement structures 22-1 to 22-$m$.

Figure 6B:
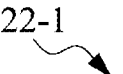
FIG. 6B illustrates an enlarged view of the reinforcement structure as shown in FIG. 6A according to some embodiments of the present disclosure.
Figure 6B:
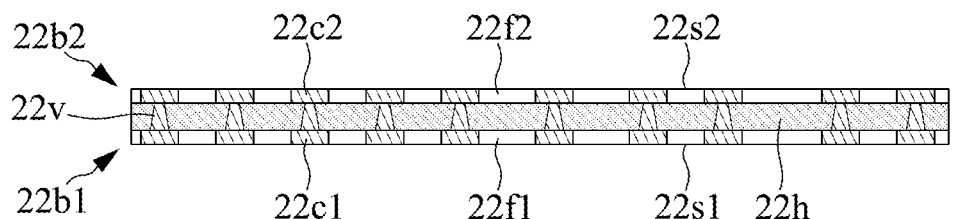

FIG. 6B illustrates an enlarged view of the reinforcement structure 22-1 as shown in FIG. 6A according to some embodiments of the present disclosure. The reinforcement structure 22-1 may include a substrate 22$h$ and conductive vias 22$v$. The substrate 22$h$ may include a semiconductor material, such as silicon. The substrate 22$h$ may include a glass, a ceramic, or a sapphire substrate. The conductive via 22$v$ may penetrate the reinforcement structure 22-1 (or substrate 22$h$). The conductive via 22$v$ may include a through-silicon via (TSV), a through-glass via (TGV), or other suitable elements. In some embodiments, each of the conductive vias 22$v$ may be tapered toward the electronic component 10 as shown in FIG. 6A.

In some embodiments, a bonding structure 22$b$1 may be disposed on or under a lower surface of the substrate 22$h$. The bonding structure 22$b$1 may function as a bonding surface for connecting another bonding surface by a hybrid-bonding technique. The bonding structure 22$b$1 may include a dielectric layer 22$f$1 (or a connection layer or a hybrid-bonding layer) and conductive elements 22$c$1.

The dielectric layer 22$f$1 may be disposed on or under the lower surface of the substrate 22$h$. In some embodiments, the dielectric layer 22$f$1 may include oxide, nitride, oxynitride, or other suitable materials.

The conductive element 22$c$1 may be embedded within the dielectric layer 22$f$1. The conductive element 22$c$1 may be exposed by the dielectric layer 22$f$1. The conductive element 22$c$1 may be exposed by a surface 22$s$1 (or a lower surface) of the reinforcement structure 22-1. The conductive element 22$c$1 may include copper or other suitable materials.

In some embodiments, a bonding structure 22$b$2 may be disposed on or over an upper surface of the substrate 22$h$. The bonding structure 22$b$2 may function as a bonding surface for connecting another bonding surface by a hybrid-bonding technique. The bonding structure 22$b$2 may include a dielectric layer 22$f$2 and conductive element 22$c$2.

The dielectric layer 22$f$2 may be disposed on or over the upper surface of the substrate 22$h$. In some embodiments, the dielectric layer 22$f$2 may include oxide, nitride, oxynitride, or other suitable materials.

The conductive element 22$c$2 may be embedded within the dielectric layer 22$f$2. The conductive element 22$c$2 may be exposed by the dielectric layer 22$f$2. The conductive element 22$c$2 may be exposed by a surface 22$s$2 (or an upper surface) of the reinforcement structure 22-1. The conductive element 22$c$2 may include copper or other suitable materials. Although FIG. 6A and FIG. 6B illustrate that the density of the conductive vias 22$v$ and the conductive vias 32$v$ is the same, the density of the conductive vias 22$v$ may be greater than that of the conductive vias 32$v$ in other embodiments.

Figure 7:
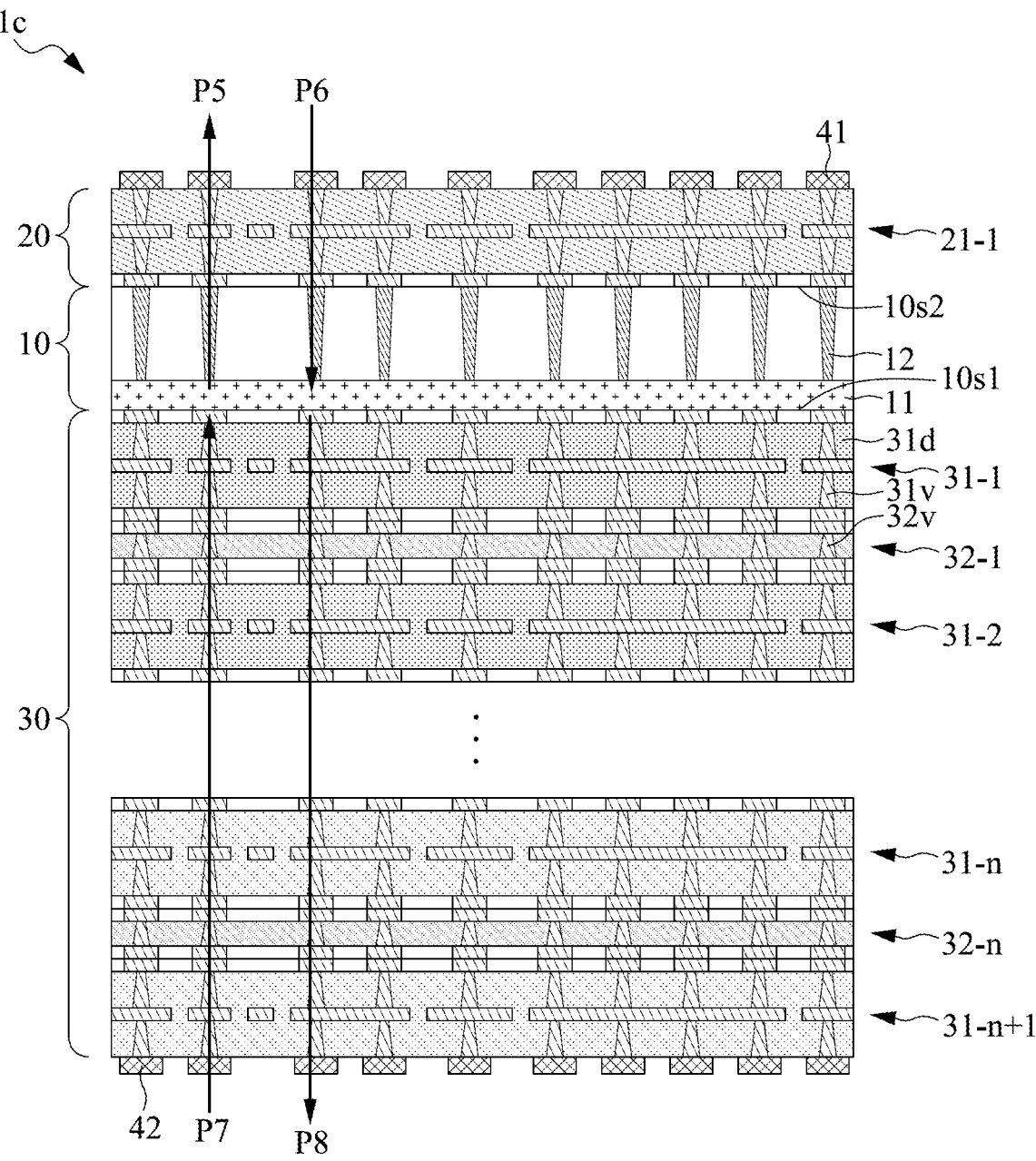
FIG. 7 illustrates a cross-sectional view of an example electronic device according to some embodiments of the present disclosure.

FIG. 7 illustrates a cross-sectional view of an example electronic device 1$c$ according to some embodiments of the present disclosure. The electronic device 1$c$ is similar to the electronic device 1$a$ as shown in FIG. 1, with differences therebetween as follows.

In some embodiments, the I/O signal delivery circuit 20 may be disposed on or over the surface 10$s$2 of the electronic component 10. In some embodiments, a signal (or I/O signal) may be transmitted to the electronic component 10 by passing through the conductive vias 12. The electronic device 1$c$ may include a signal path P5 for transmitting an I/O signal. The signal path P5 may pass through the conductive vias 12 and the I/O signal delivery circuit 20. The electronic device 1$c$ may include a power path P6 for transmitting power. The power path P6 may pass through the redistribution structure 21-1.

In some embodiments, the power delivery circuit 30 may be disposed on or under the surface 10$s$1 of the electronic component 10. In some embodiments, a power (or a power signal) may be transmitted to the electronic component 10 without passing the conductive via 12. For example, the electronic device 1$c$ may include a power path P7 for transmitting a power signal. The signal path P7 may pass through the redistribution structures 31-1 to 31-$n$+1 and the reinforcement structures 32-1 to 32-$n$. In some embodiments, the conductive via 32$v$ of the reinforcement structure 32-1 may be tapered toward the electronic component 10. In this embodiment, a power may be transmitted to the electronic component 10 with a relatively short transmission path, which thereby reduces the power loss. In some embodiments, some traces (or vias) of the redistribution structures 31-1 to 31-$n$+1 and reinforcement structures 32-1 to 32-$n$ may be configured to transmit a signal (e.g., an I/O signal). The electronic device 1$c$ may include a signal path P8 for transmitting an I/O signal. The signal path P8 may pass through the redistribution structures 31-1 to 31-$n$+1. The power path P8 may pass through the reinforcement structures 32-1 to 32-$n$.

Figure 8A:
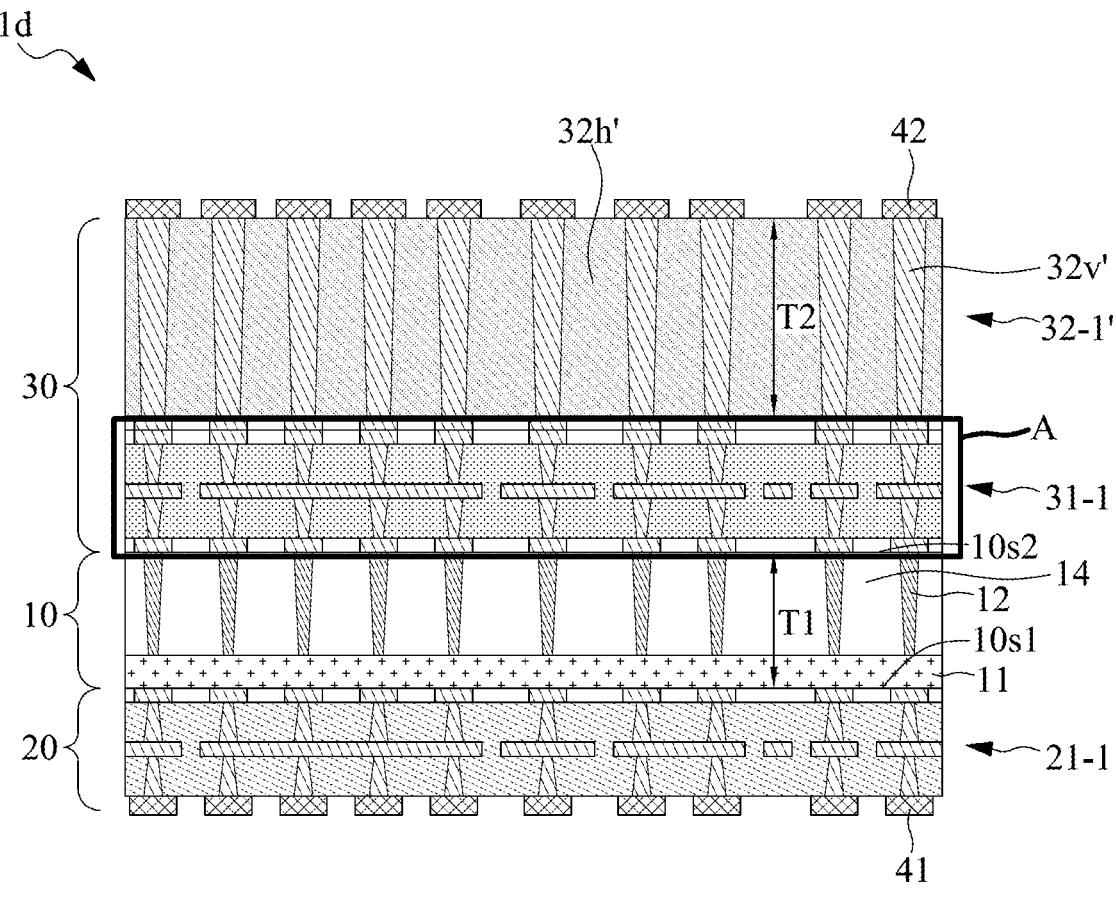
FIG. 8A illustrates a cross-sectional view of an example electronic device according to some embodiments of the present disclosure.

FIG. 8A illustrates a cross-sectional view of an example electronic device 1$d$ according to some embodiments of the present disclosure. The electronic device 1$d$ is similar to the electronic device 1$a$ as shown in FIG. 1, with differences therebetween as follows.

The structure of region A as shown in FIG. 8A may the same as or similar to the structure of FIG. 2A. In some embodiments, the electronic device 1$d$ may include a reinforcement structure 32-1'. The reinforcement structure 32-1' may be disposed on or over the redistribution structure 31-1. The reinforcement structure 32-1' may include a substrate 32$h$' and conductive vias 32$v$'. In some embodiments, a thickness T1 of the electronic component 10 (or a thickness of the base portion 14 of the electronic component 10) may be less than a thickness T2 of the reinforcement structure 32-1'. In some embodiments, the dimension (e.g., diameter or width) of the conductive via 32$v$' may be greater than that of the conductive via 12. In some cases, the electronic component 10 may have fewer functions so that fewer layers of the conductive traces and conductive vias are required. In this condition, a reinforcement structure with a greater thickness may be used to enhance the rigidity. Further, the reinforcement structure 32-1' may facilitate the formation of the conductive via 32$v$' with a greater dimension, which thereby reduces the impedance of the power delivery circuit 30. In some cases, the base portion 14 of the electronic component 10 may be thinned to facilitate in formation of the conductive vias 12, which weakens the rigidity of the electronic component 10. In this condition, the reinforcement structure 32-1' may strengthen the rigidity of the structure (or intermediate structure), which facilitates manufacturing procedures, such as singulation stage, pick and place (P&P) stage, or other stages.

Figure 8B:
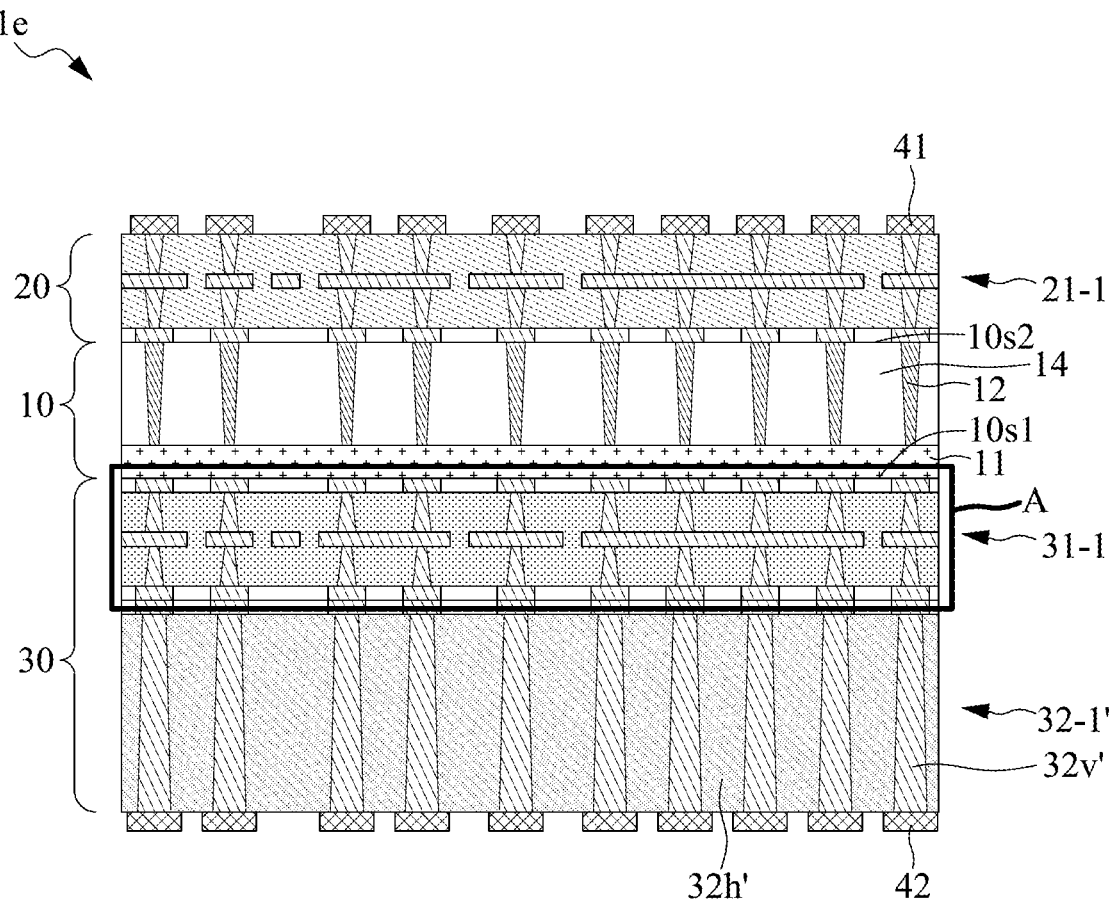
FIG. 8B illustrates a cross-sectional view of an example electronic device according to some embodiments of the present disclosure.

FIG. 8B illustrates a cross-sectional view of an example electronic device 1$e$ according to some embodiments of the present disclosure. The electronic device 1$e$ is similar to the electronic device 1$d$ as shown in FIG. 8A, with differences therebetween as follows.

The structure of region A as shown in FIG. 8B may the same as or similar to the structure of FIG. 2A. In some embodiments, the reinforcement structure 32-1' may be disposed on or under the surface 10$s$1 of the electronic component 10. In some embodiments, a power (or a power signal) may be transmitted to the electronic component 10 without passing the conductive via 12. In this embodiment, a power may be transmitted to the electronic component 10 with a relatively short transmission path, which thereby reduces the power loss. In some cases, the base portion 14 of the electronic component 10 may be thinned to facilitate in formation of the conductive vias 12, which weakens the rigidity of the electronic component 10. In this condition, the reinforcement structure 32-1' may strengthen the rigidity of the structure (or intermediate structure), which facilitates the manufacturing procedures, such as singulation stage, pick and place (P&P) stage, or other stages.

FIG. 9A, FIG. 9B, FIG. 9C, FIG. 9D, FIG. 9E, FIG. 9F, FIG. 9G, FIG. 9H, and FIG. 9I illustrate one or more stages of an example of a method for manufacturing an electronic device according to some embodiments of the present disclosure.

Figure 9A:
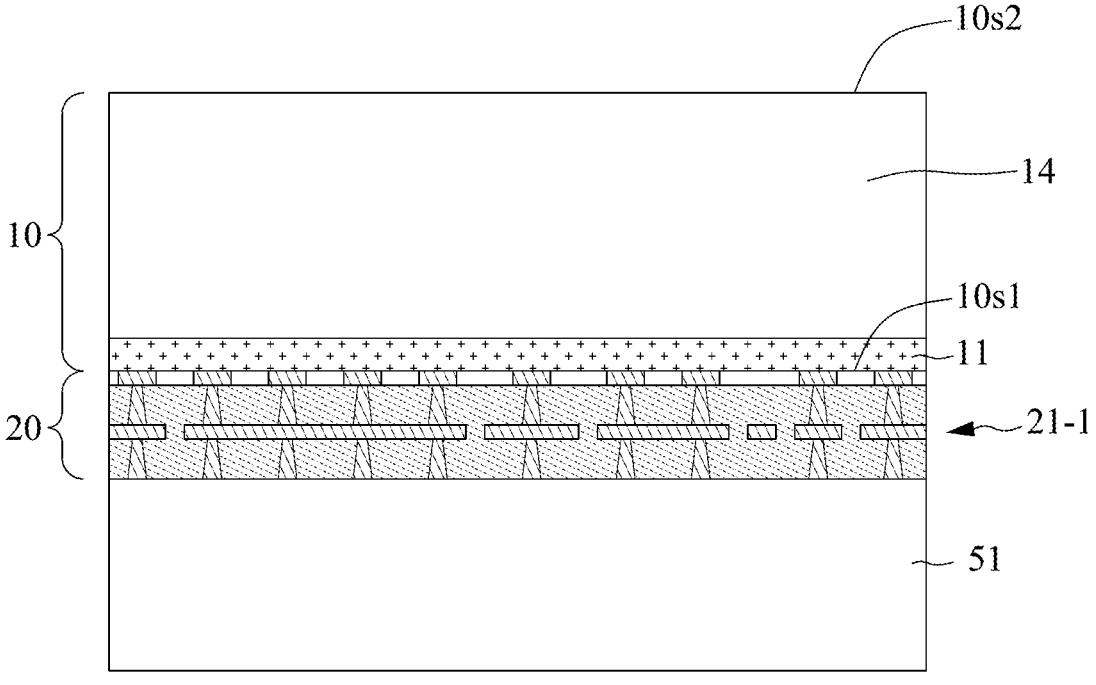
FIG. 9A, FIG. 9B, FIG. 9C, FIG. 9D, FIG. 9E, FIG. 9F, FIG. 9G, FIG. 9H, and FIG. 9I illustrate one or more stages of an example of a method for manufacturing an electronic device according to some embodiments of the present disclosure.

Referring to FIG. 9A, an electronic component 10 may be provided or received. An I/O signal delivery circuit 20, including a redistribution structure 21-1, may be formed on or under a surface 10s1 of the electronic component 10. The redistribution structure 21-1 may be attached to a carrier 51. In some embodiments, the carrier 51 may include a silicon carrier, a glass carrier, or other suitable carriers.

Figure 9B:
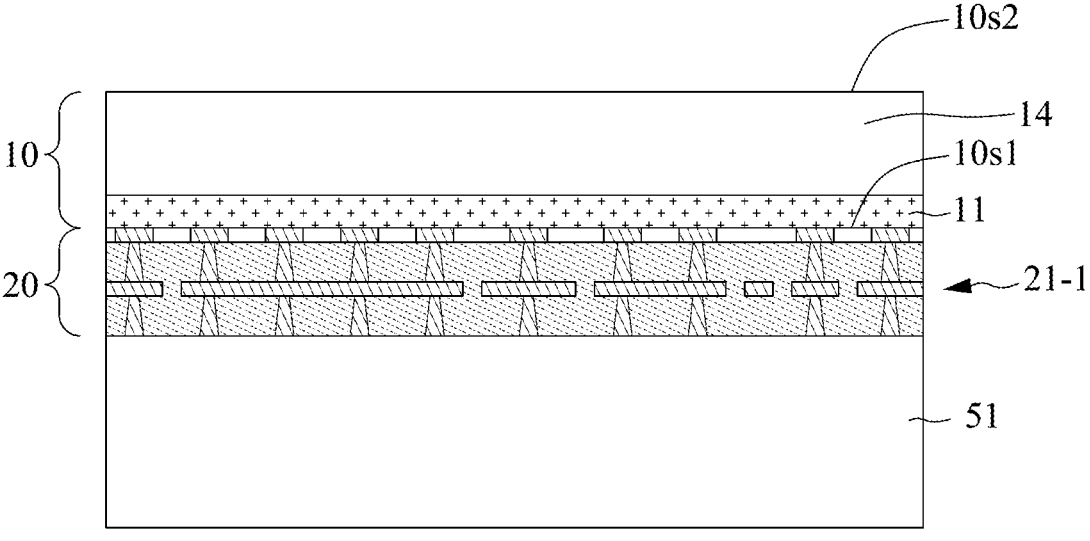

Referring to FIG. 9B, a surface 10s2 of the electronic component 10 may be polished or grinded to reduce the overall thickness (or the thickness of the base portion 14) of the electronic component 10, which facilitates in formation of conductive vias 12 in subsequent stages. For example, a chemical mechanical polishing technique may be performed. In some cases, the base portion 14, not thinned, may cause the conductive vias 12 to have greater lengths, which has a negative influence on formation of the conductive vias 12.

Figure 9C:
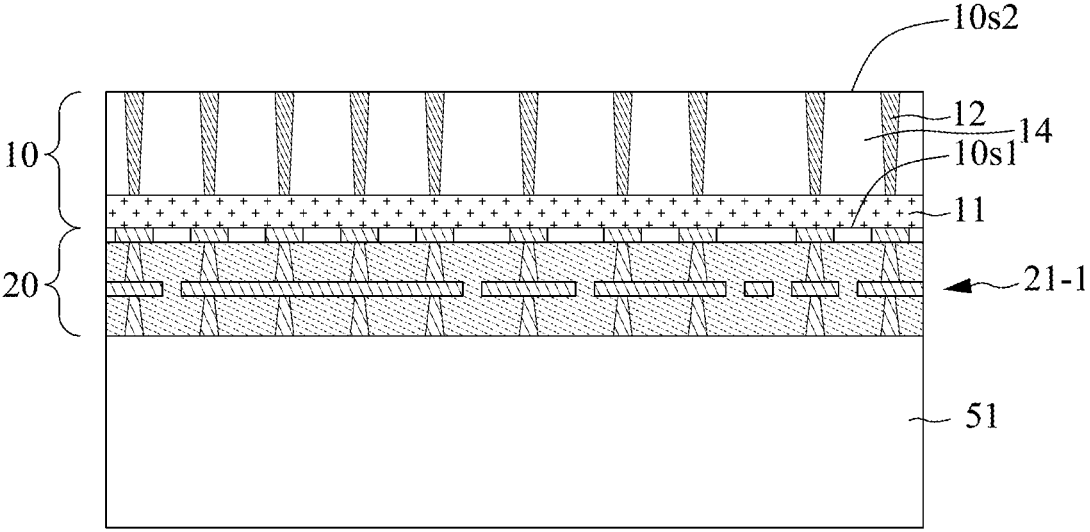

Referring to FIG. 9C, conductive vias 12 may be formed to penetrate at least a portion of the electronic component 10 (or penetrate the base portion 14) and connected to the circuit layer 11. Each of the conductive vias 12 may extend from the surface 10s2 of the electronic component 10.

Figure 9D:
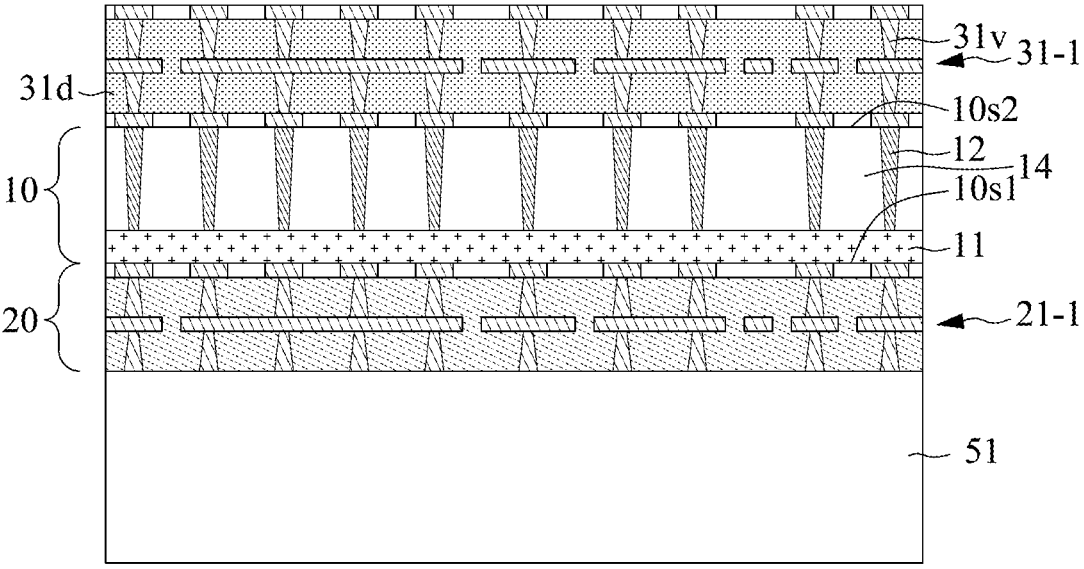

Referring to FIG. 9D, a redistribution structure 31-1 may be formed on or over the electronic component 10. The redistribution structure 31-1 may be electrically connected to the conductive vias 12.

Figure 9E:
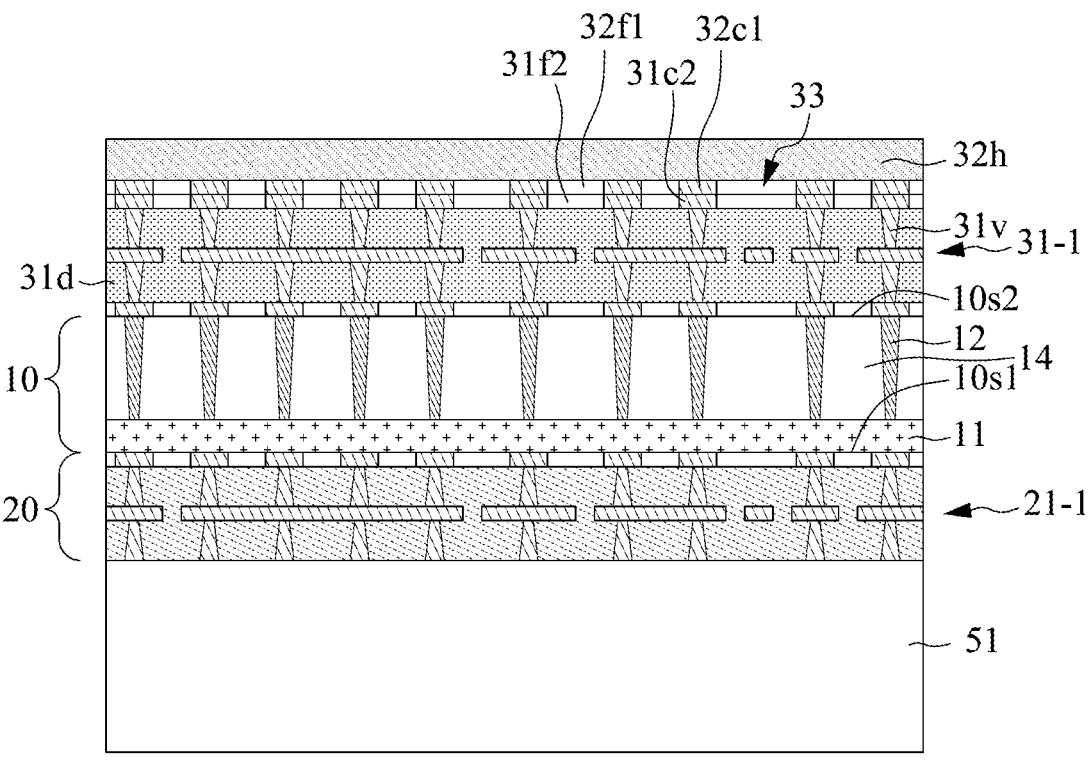

Referring to FIG. 9E, a substrate 32h may be bonded to or attached to the redistribution structure 31-1. In some embodiments, the substrate 32h may be bonded to or attached to the redistribution structure 31-1 by a hybrid-bonding technique. A hybrid-bonding structure 33 may be formed between the substrate 32h and the redistribution structure 31-1. The hybrid-bonding structure 33 may include a dielectric layer, such as silicon oxide, and conductive elements, such as copper pads. For example, the hybrid-bonding structure 33 may include a bonding between conductive elements 31c2 and 32c1 as well as a bonding between dielectric layers 31f2 and 32f1.

Figure 9F:
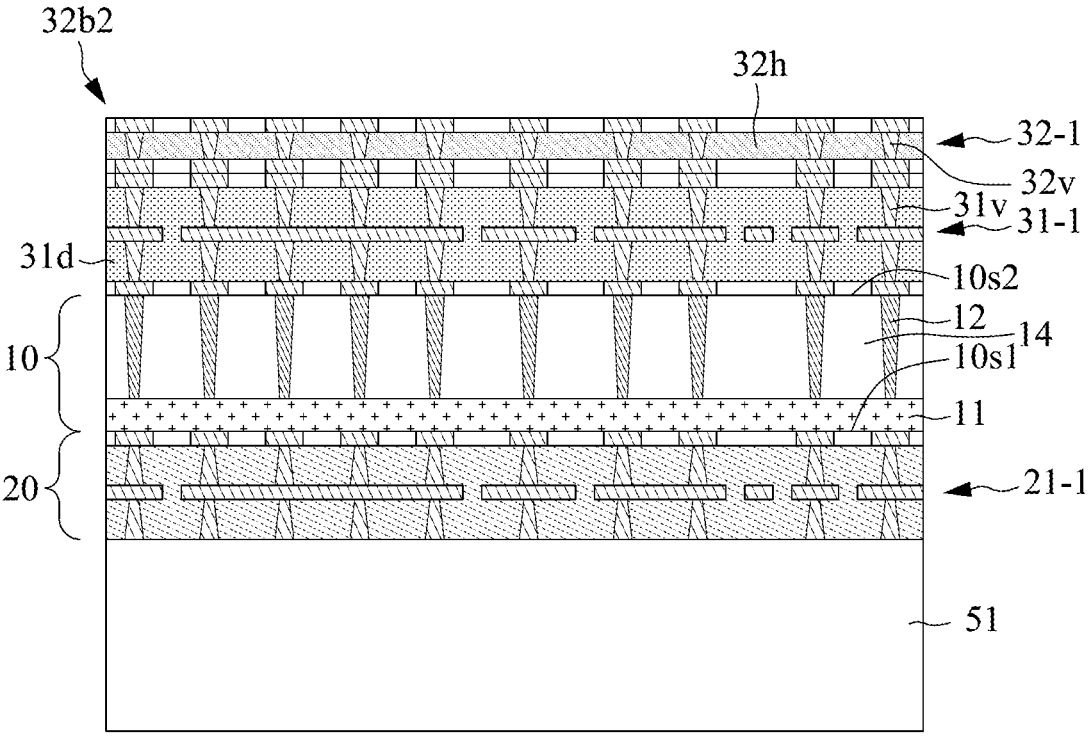

Referring to FIG. 9F, conductive vias 32v may be formed to penetrate the substrate 32h. A bonding structure 32b2 may be formed on or over the substrate 32h. The reinforcement structure 32-1 may be produced. In some embodiments, the substrate 32h may be thinned to facilitate in formation of conductive vias (e.g., 32v as shown in FIG. 4).

Figure 9G:
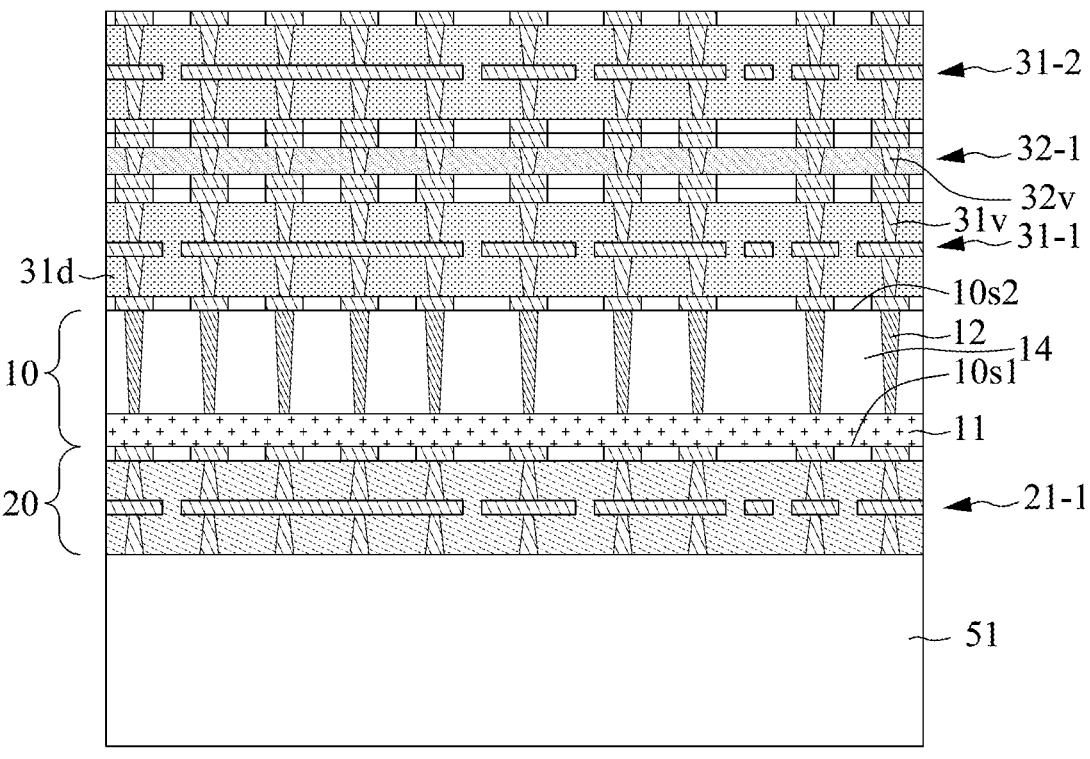

Referring to FIG. 9G, a redistribution structure 31-2 may be formed on or over the reinforcement structure 32-1.

Figure 9H:
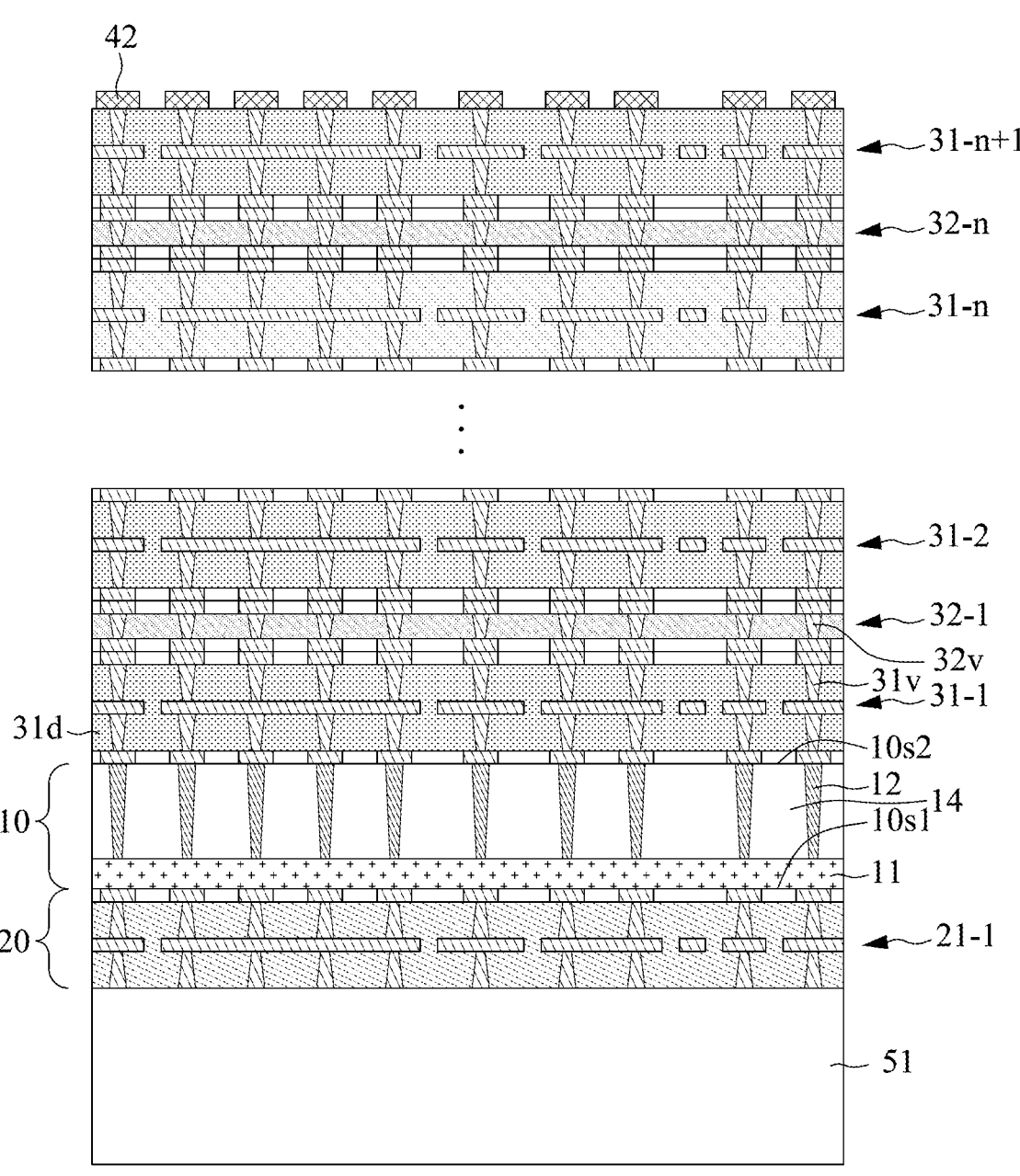

Referring to FIG. 9H, the stages as shown in FIG. 9E to FIG. 9G may be repeated to form multiple redistribution structures (e.g., redistribution structures 31-n and 31-n+1)

and reinforcement structures (e.g., reinforcement structure 32-n). Terminals 42 may be formed on or over the redistribution structure 31-n+1. Since the reinforcement structures 32-1 to 32-n balance the warpage of two opposite surface 10s1 and 10s2 of the electronic component 10, multiple redistribution structures 31-1 and 31-n+1 may be formed to design power routing paths, which thereby facilitates in integrating different functions of ICs of an electronic device.

Figure 9I:
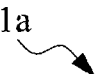

Referring to FIG. 9I, the carrier 51 may be removed. Terminal 41 may be formed on or under the redistribution structure 21-1. As a result, an electronic device may be produced, such as the electronic device 1a as shown in FIG. 1.

FIG. 10A, FIG. 10B, FIG. 10C, FIG. 10D, FIG. 10E, and FIG. 10F illustrate one or more stages of an example of a method for manufacturing an electronic device according to some embodiments of the present disclosure.

Figure 10A:
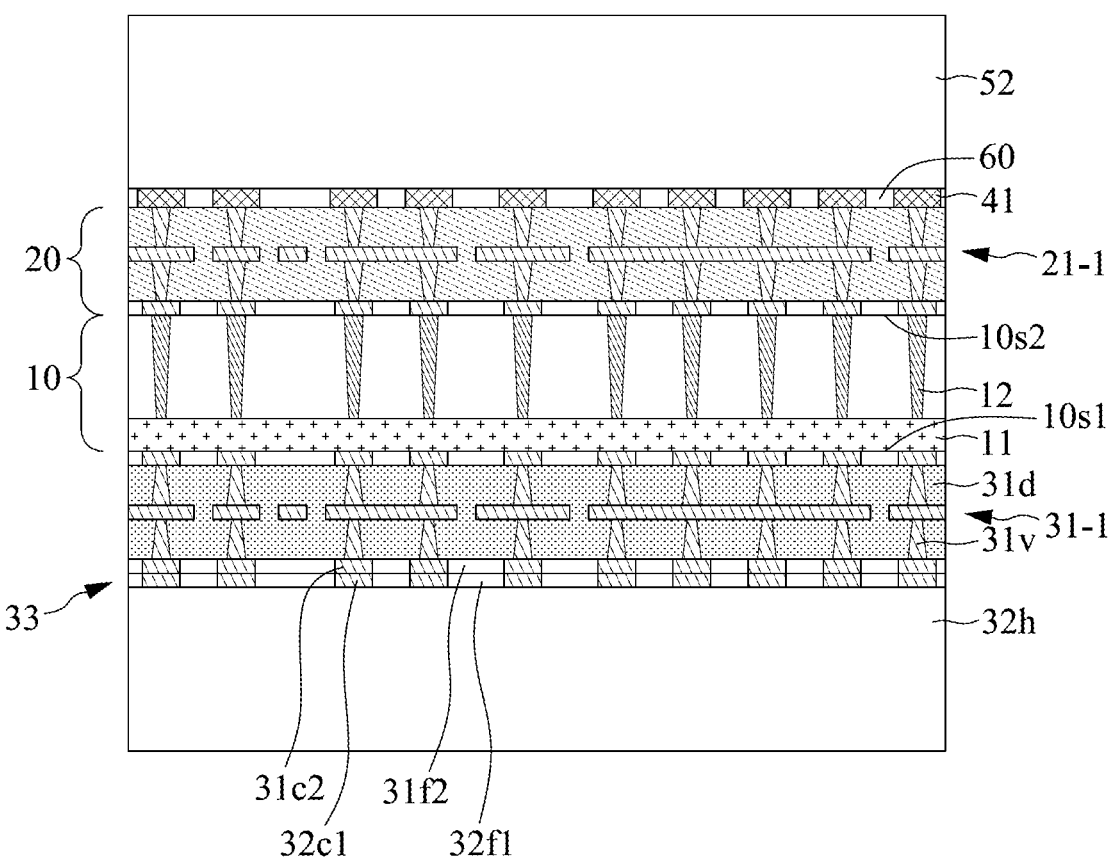
FIG. 10A, FIG. 10B, FIG. 10C, FIG. 10D, FIG. 10E, and FIG. 10F illustrate one or more stages of an example of a method for manufacturing an electronic device according to some embodiments of the present disclosure.

Referring to FIG. 10A, an electronic component 10 may be provided or received. A redistribution structure 21-1 may be formed on or over the surface 10s2 of the electronic component 10. Terminals 41 may be formed on or over the redistribution structure 21-1. The terminals 41 may be attached to a carrier 52. The carrier 52 may include a silicon carrier, a glass carrier, or other suitable carriers. A release film 60 may be formed to fill the gaps defined by the carrier 52 and the terminals 41. A redistribution structure 31-1 may be formed on or under the surface 10s1 of the electronic component 10. A substrate 32h may be bonded to or attached to the redistribution structure 31-1. In some embodiments, the substrate 32h may be bonded to or attached to the redistribution structure 31-1 by a hybrid-bonding technique. A hybrid-bonding structure 33 may be formed between the redistribution structure 31-1 and substrate 32h. For example, the hybrid-bonding structure 33 may include a bonding between conductive elements 31c2 and 32c1 as well as a bonding between dielectric layers 31f2 and 32f1.

Figure 10B:
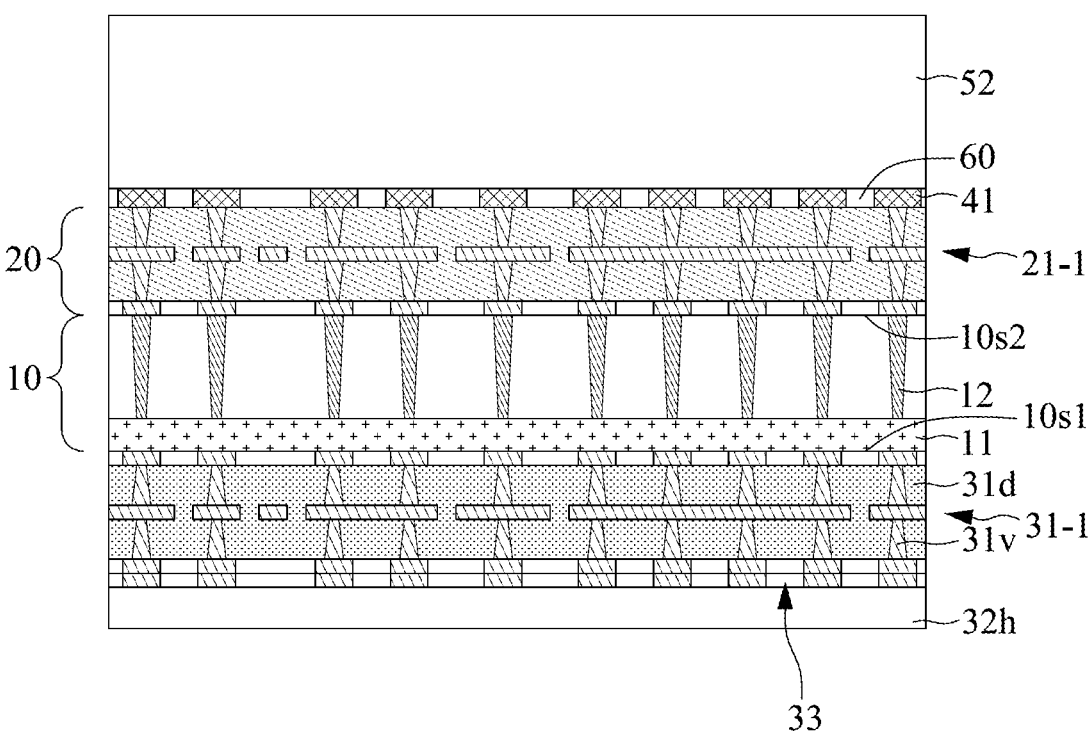

Referring to FIG. 10B, the substrate 32h may be polished or grinded.

Figure 10C:
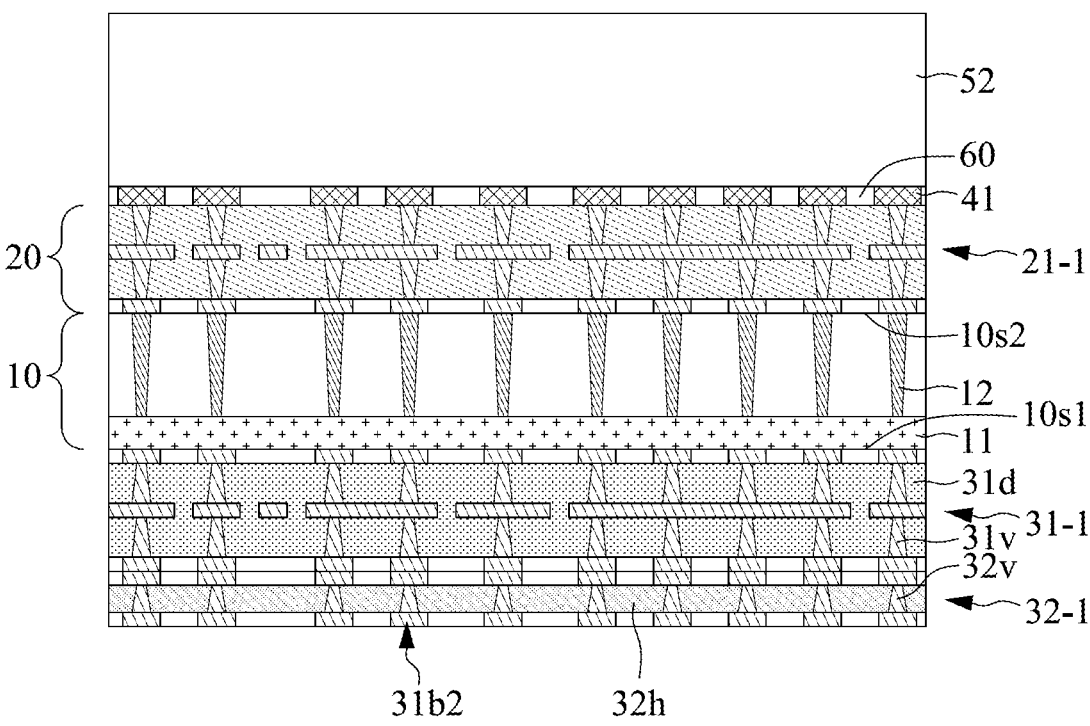

Referring to FIG. 10C, conductive vias 32v may be formed to penetrate the substrate 32h. A bonding structure 32b2 may be formed on or under the substrate 32h. The reinforcement structure 32-1 may be produced.

Figure 10D:
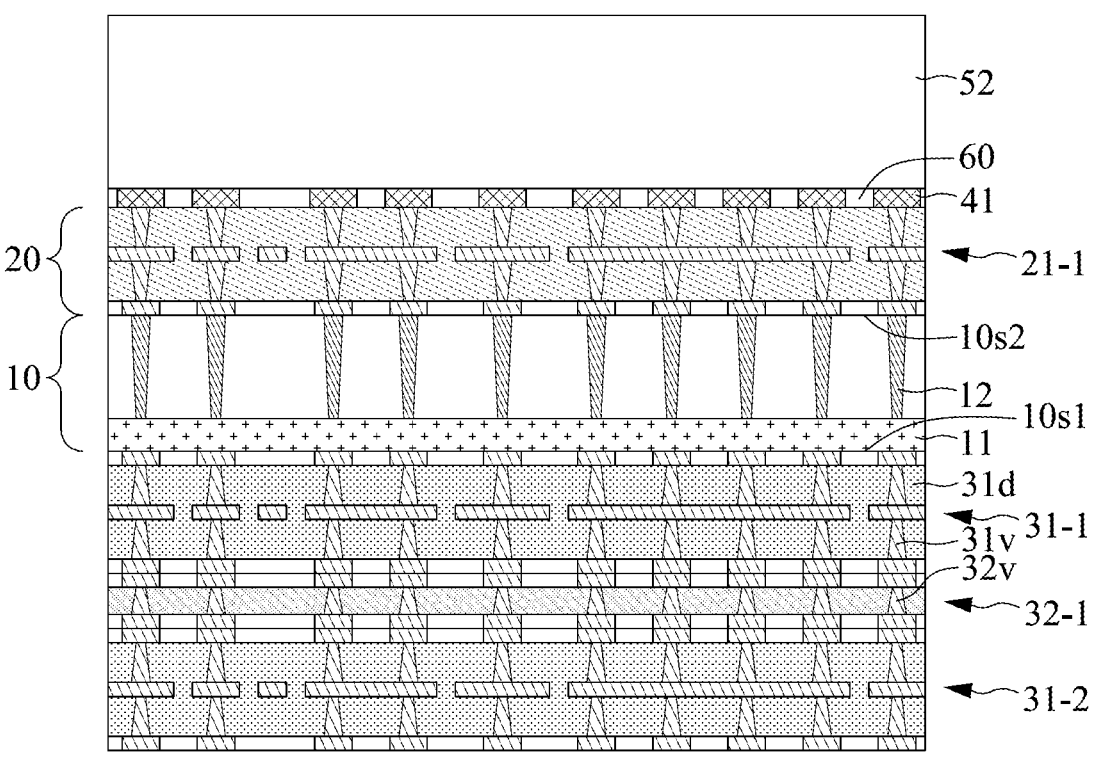

Referring to FIG. 10D, the redistribution structure 31-2 may be formed on or under the reinforcement structure 32-1.

Figure 10E:
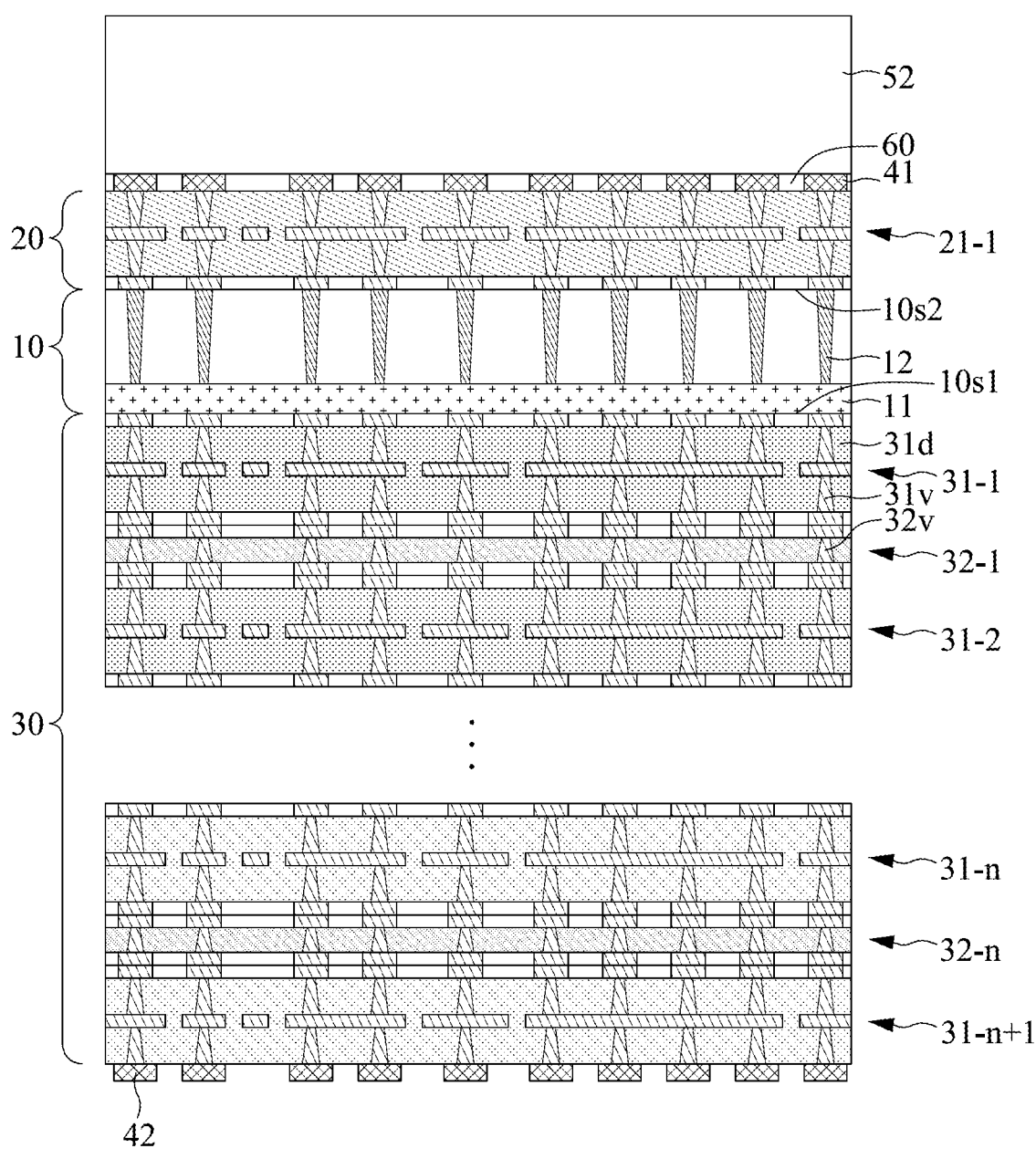

Referring to FIG. 10E, the stages as shown in FIG. 10B to FIG. 10D may be repeated to form multiple redistribution structures (e.g., redistribution structures 31-n and 31-n+1) and reinforcement structures (e.g., reinforcement structure 32-n). Terminals 42 may be formed on or under the redistribution structure 31-n+1.

Figure 10F:
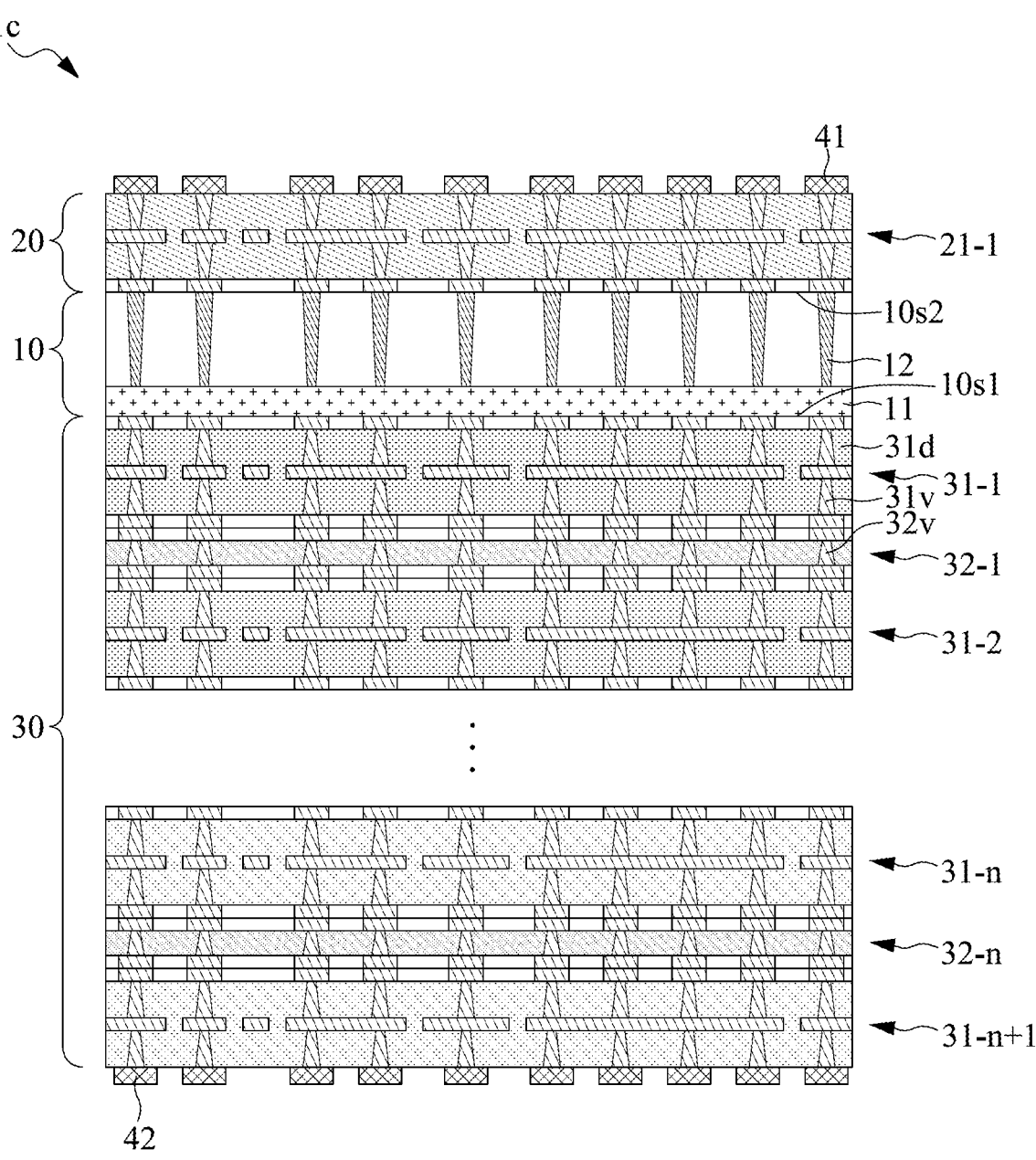

Referring to FIG. 10F, the carrier 52 and the release film 60 may be removed. As a result, an electronic device may be produced, such as the electronic device 1c as shown in FIG. 7.

Figure 11A:
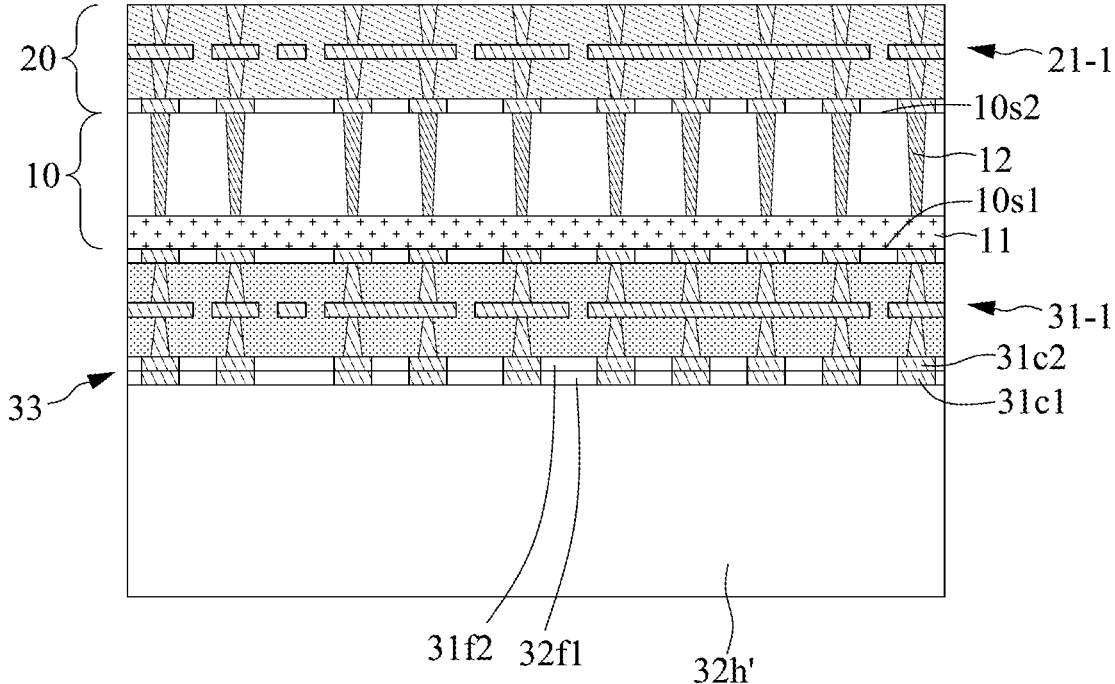
FIGS. 11A, 11B, and 11C illustrate one or more stages of an example of a method for manufacturing an electronic device according to some embodiments of the present disclosure.
Figure 11B:
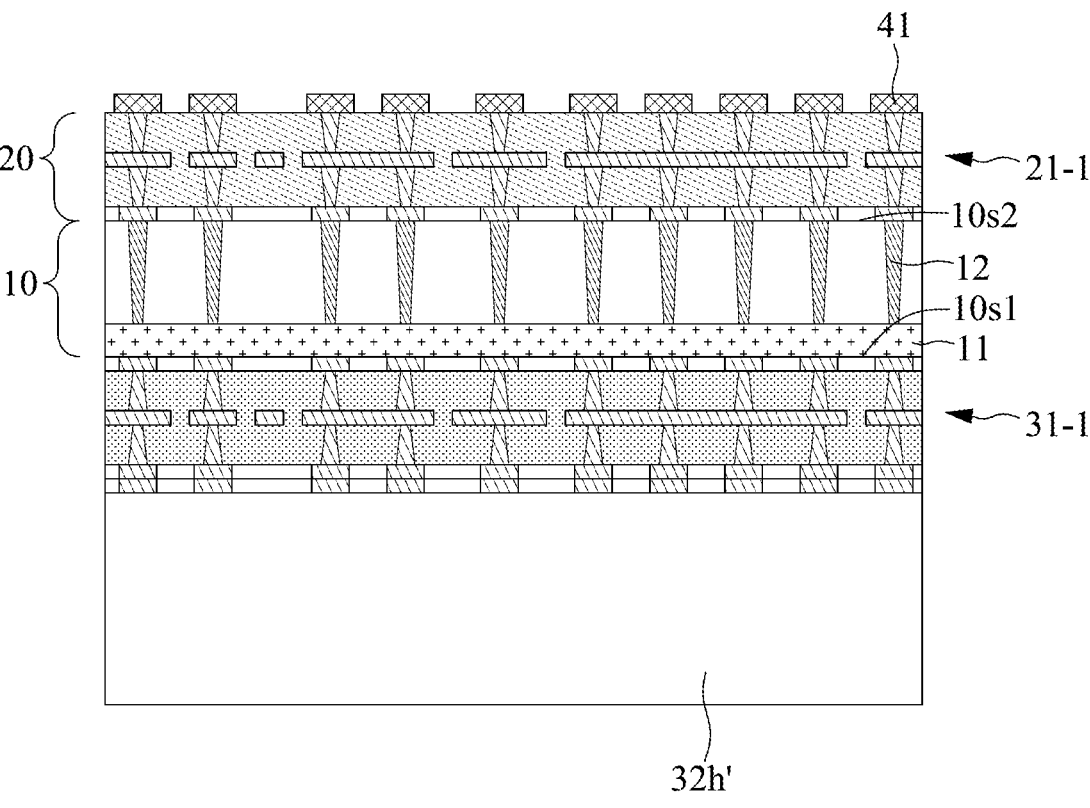
Figure 11C:
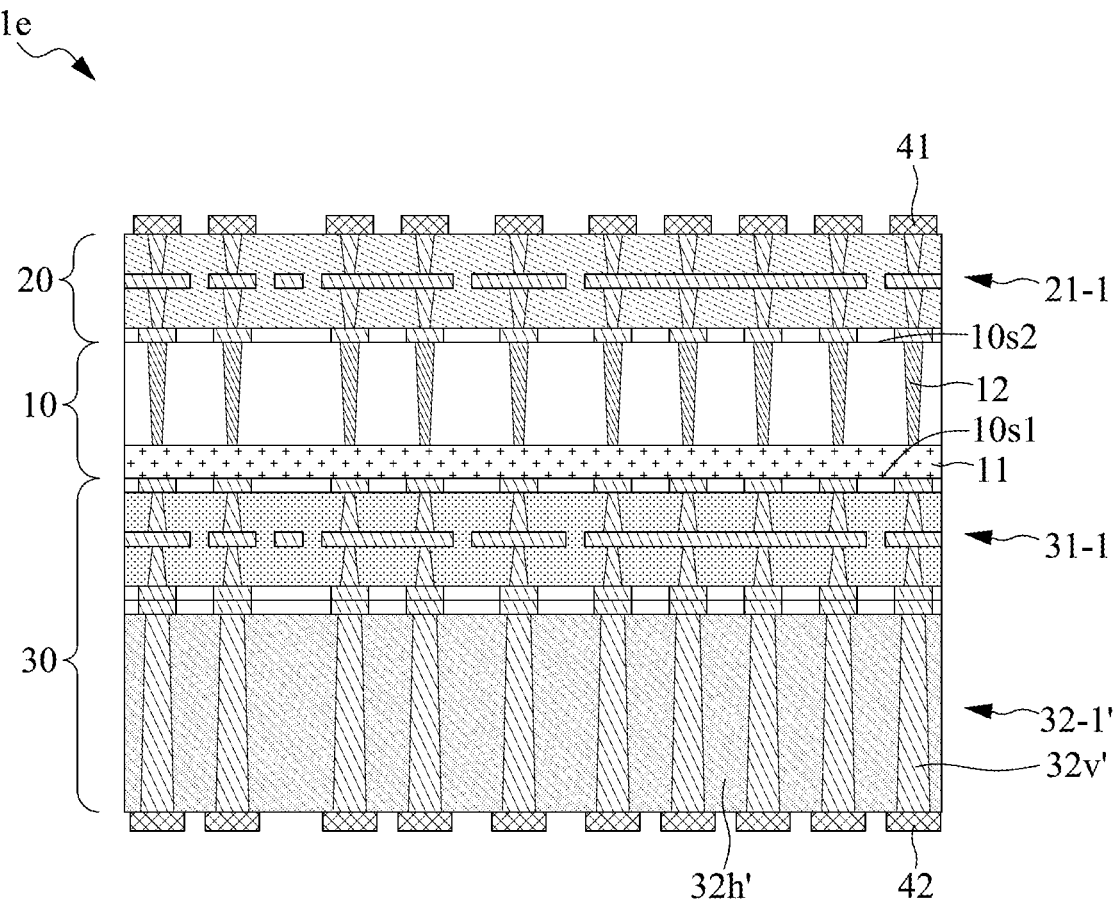

FIG. 11A, FIG. 11B, and FIG. 11C illustrate one or more stages of an example of a method for manufacturing an electronic device according to some embodiments of the present disclosure.

Referring to FIG. 11A, an electronic component 10 may be provided or received. A redistribution structure 21-1 may be formed on or over the surface 10s2 of the electronic component 10. A redistribution structure 31-1 may be formed on or under the surface 10s1 of the electronic component 10. A substrate 32h' may be bonded to or attached to the redistribution structure 31-1 by a hybrid-bonding technique to form a hybrid-bonding structure 33. For example, the hybrid-bonding structure 33 may include a bonding between conductive elements 31c2 and 32c1 as well as a bonding between dielectric layers 31f2 and 32f1.

Referring to FIG. 11B, terminals 41 may be formed on or over the redistribution structure 21-1.

Referring to FIG. 11C, conductive vias 32v' may be formed to penetrate the substrate 32h'. A reinforcement structure 32-1' may be produced. Terminals 42 may be formed or under the reinforcement structure 32-1'. As a result, an electronic device may be produced, such as the electronic device 1e as shown in FIG. 8B.

FIG. 12A, FIG. 12B, FIG. 12C, and FIG. 12D illustrate one or more stages of an example of a method for manufacturing an electronic device according to some embodiments of the present disclosure.

Figure 12A:
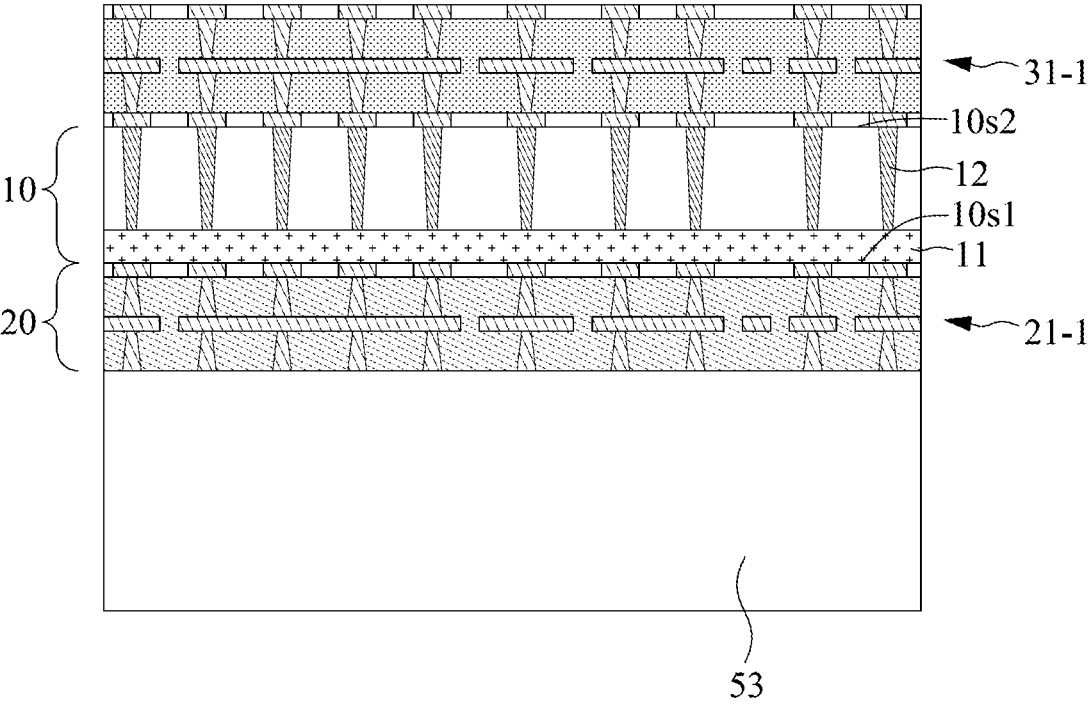
FIGS. 12A, 12B, 12C, and FIG. 12D illustrate one or more stages of an example of a method for manufacturing an electronic device according to some embodiments of the present disclosure.

Referring to FIG. 12A, an electronic component 10 may be provided or received. An I/O signal delivery circuit 20, including a redistribution structure 21-1, may be formed on or under a surface 10s1 of the electronic component 10. The redistribution structure 21-1 may be attached to a carrier 53. A redistribution structure 31-1 may be formed on or over a surface 10s2 of the electronic component 10.

Figure 12B:
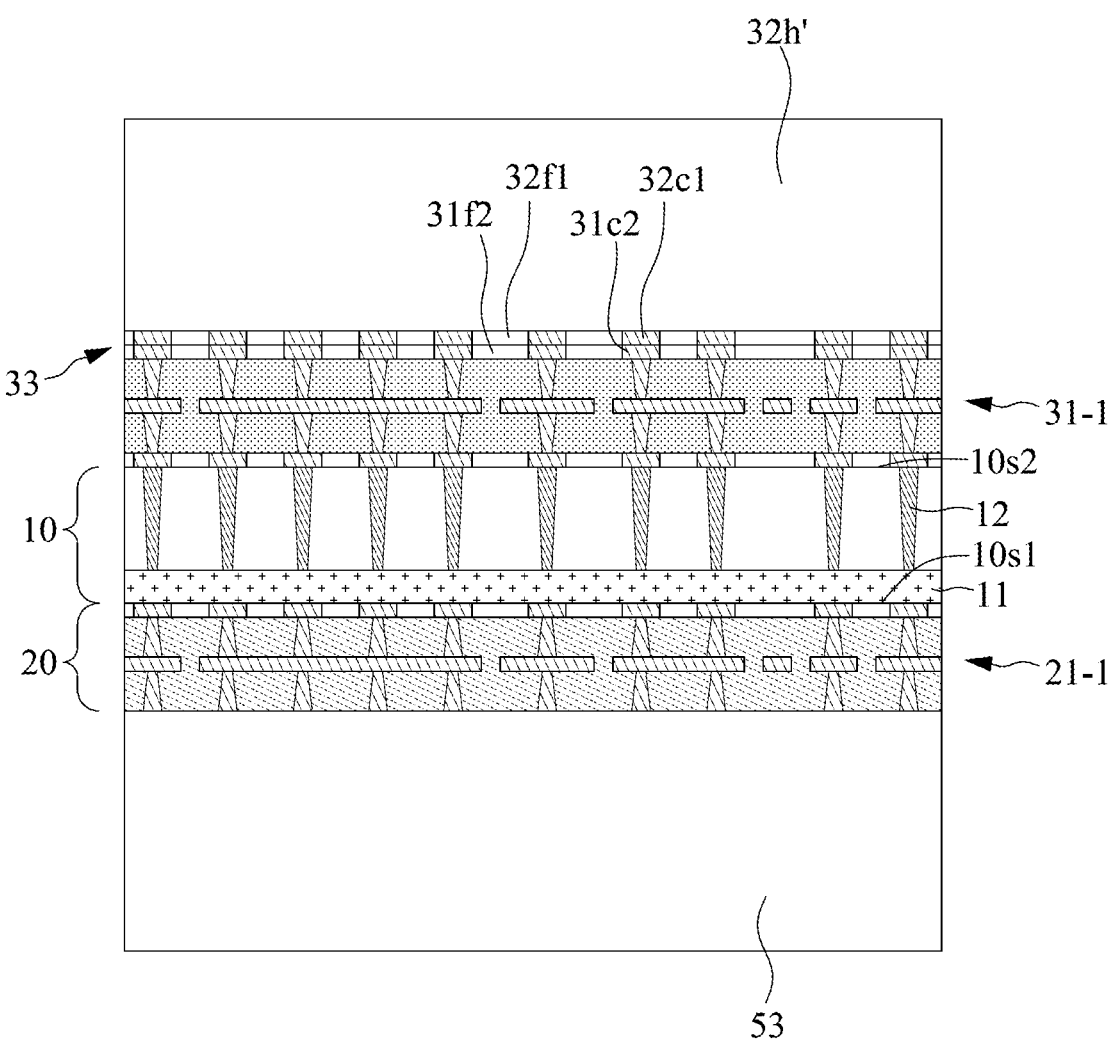

Referring to FIG. 12B, a substrate 32h' may be attached to or bonded to the redistribution structure 31-1 by a hybrid-bonding technique to form a hybrid-bonding structure 33. For example, the hybrid-bonding structure 33 may include a bonding between conductive elements 31c2 and 32c1 as well as a bonding between dielectric layers 31f2 and 32f1.

Figure 12C:
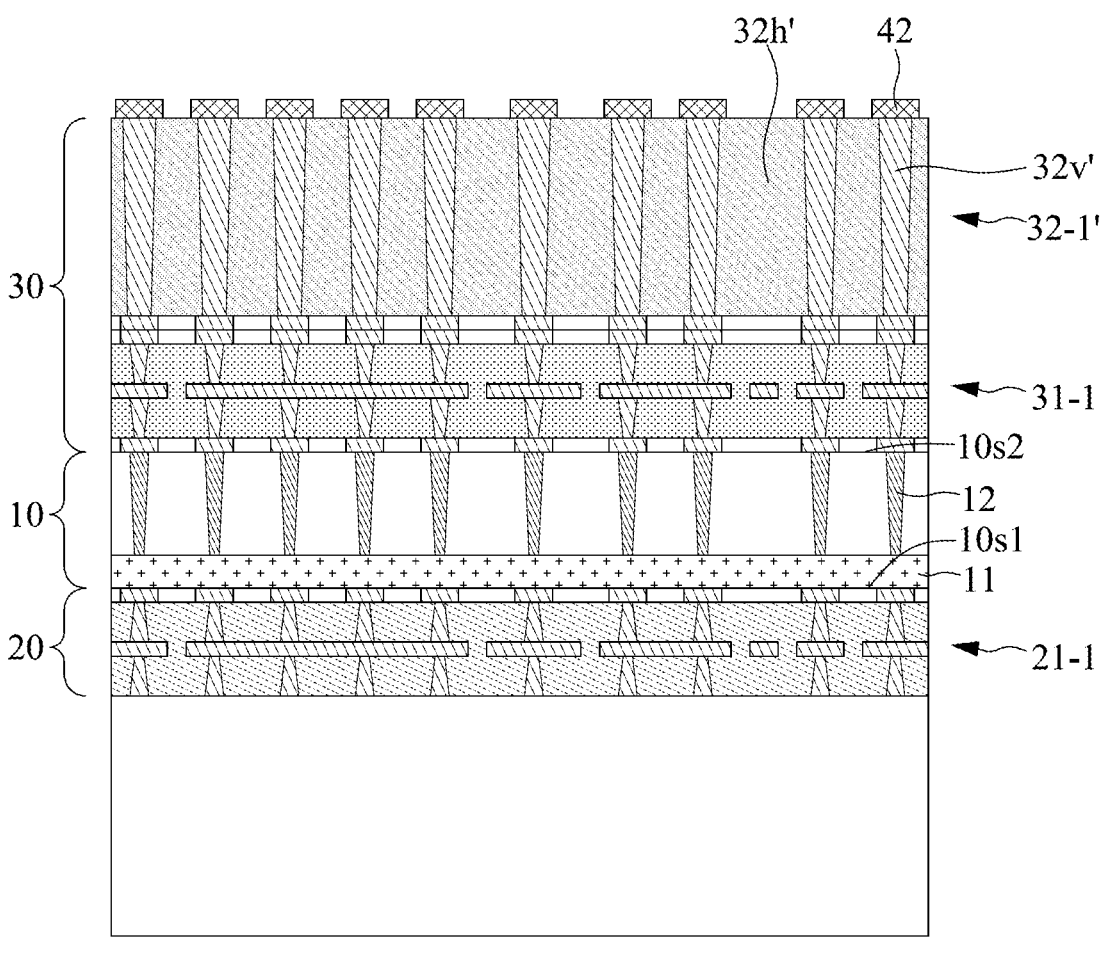

Referring to FIG. 12C, conductive vias 32v' may be formed to penetrate the substrate 32h'. A reinforcement structure 32-1' may be produced. Terminals 42 may be formed or under the reinforcement structure 32-1'.

Figure 12D:
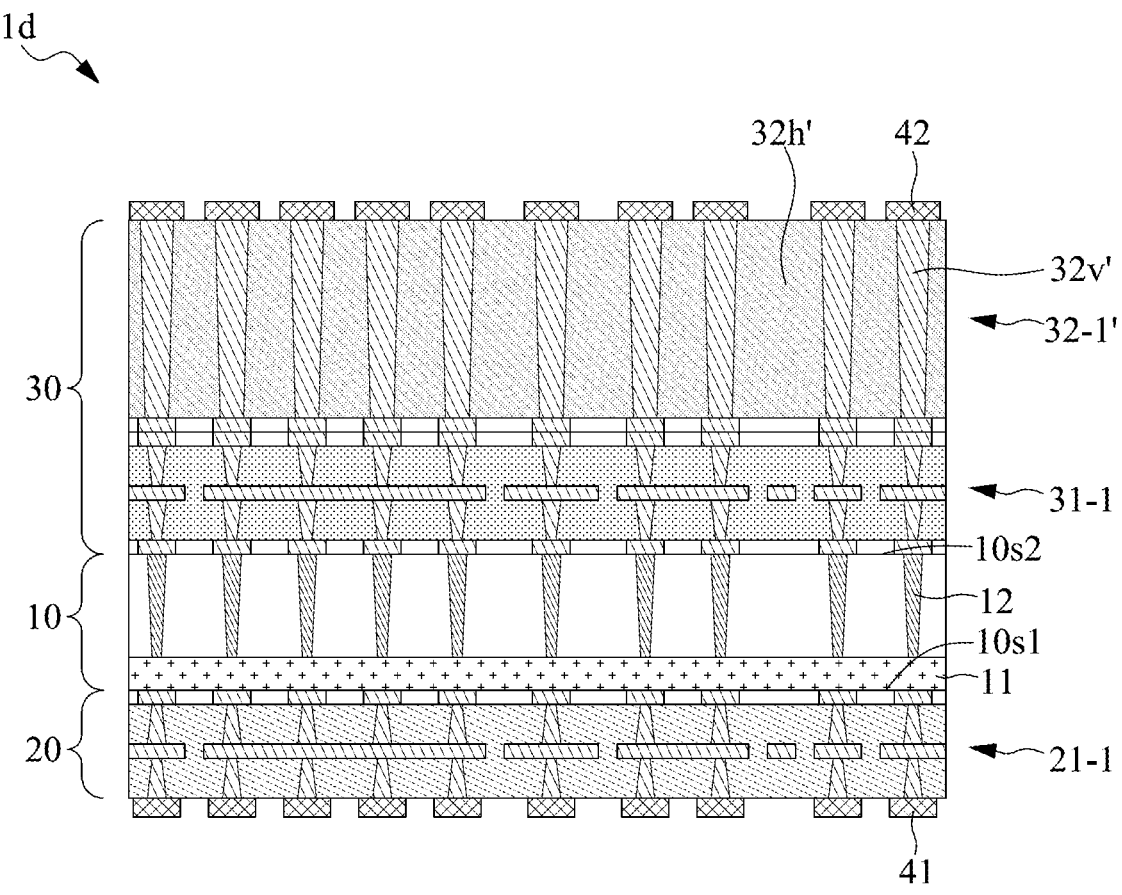

Referring to FIG. 12D, the carrier 53 may be removed. Terminals 41 may be formed on or under the redistribution structure 21-1. As a result, an electronic device may be produced, such as the electronic device 1d as shown in FIG. 8A.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 10+S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   an electronic component having a first surface and a second surface opposite to the first surface;
   an input/output (I/O) signal delivery circuit disposed under the first surface of the electronic component; and
   a power delivery circuit disposed over the second surface of the electronic component and configured to balance a warpage of the electronic device,
   wherein the power delivery circuit comprises a first reinforcement structure configured to enhance a rigidity of the power delivery circuit, the power delivery circuit comprises a first redistribution structure and a second redistribution structure sandwiching the first reinforcement structure, the first reinforcement structure includes a first conductive layer, the first redistribution structure includes a second conductive layer, and the first conductive layer is directly bonded to the second conductive layer, the first reinforcement structure includes a first dielectric layer, the second redistribution structure includes a second dielectric layer, and the first dielectric layer is directly bonded to the second dielectric layer.

2. The electronic device of claim 1, wherein the first reinforcement structure comprises a plurality of through-vias configured to transmit a power to the electronic component.

3. The electronic device of claim 2, wherein each of the plurality of through-vias is tapered toward the electronic component.

4. An electronic device, comprising:

an electronic component having a first surface and a second surface opposite to the first surface;

an input/output (I/O) signal delivery circuit disposed under the first surface of the electronic component; and a power delivery circuit disposed over the second surface of the electronic component and configured to balance a warpage of the electronic device, wherein the power delivery circuit comprises a first reinforcement structure configured to enhance a rigidity of the power delivery circuit, the power delivery circuit comprises a first redistribution structure and a second redistribution structure sandwiching the first reinforcement structure, and wherein the first redistribution structure comprises a first conductive pattern with a first surface area and a second conductive pattern with a second surface area different from the first surface area.

5. The electronic device of claim 4, wherein the first conductive pattern is configured to transmit a first power, and the second conductive pattern is configured to transmit a second power different from the first power.

6. The electronic device of claim 4, wherein the first redistribution structure comprises first vias connected to the first conductive pattern and second vias connected to the second conductive pattern, and a first dimension of each of the first vias is substantially the same as a second dimension of each of the second vias.

7. The electronic device of claim 4, wherein the first redistribution structure comprises a plurality of first vias connected to the first conductive pattern and a plurality of second vias connected to the second conductive pattern, and a quantity of the first vias is different from a quantity of the second vias.

8. The electronic device of claim 1, wherein a dielectric material of the I/O signal delivery circuit has a coefficient of thermal expansion different from that of the power delivery circuit.

9. The electronic device of claim 1, wherein the electronic component includes a base portion supporting the I/O signal delivery circuit, and a thickness of the first reinforcement structure is greater than a thickness of the base portion of the electronic component.

10. An electronic device, comprising:

an electronic component having a front surface and a backside surface opposite to the front surface;

a first redistribution structure disposed over the backside surface of the electronic component; and a reinforcement structure disposed over the first redistribution structure, wherein the first redistribution structure and the reinforcement structure are collectively configured to transmit a power to the electronic component, and wherein the electronic component comprises a logic portion adjacent to the front surface, a base portion adjacent to the backside surface and at least one through-via passing through the base portion, and the through-via is electrically connected to the first redistribution structure and the logic portion.

11. The electronic device of claim 10, further comprising:

a second redistribution structure, wherein the reinforcement structure is disposed between the first redistribution structure and the second redistribution structure.

12. The electronic device of claim 10, wherein the first redistribution structure includes a first dielectric element, the reinforcement structure includes a second dielectric element, wherein a material of the first dielectric element is different from a material of the second dielectric element.

13. The electronic device of claim 10, wherein a material of the base portion and a material of the reinforcement structure comprises silicon.

* * * * *